US011791936B2

United States Patent
Chen et al.

(10) Patent No.: US 11,791,936 B2
(45) Date of Patent: Oct. 17, 2023

(54) EQUIVALENT PUNCTURE SETS FOR POLAR CODED RE-TRANSMISSIONS

(71) Applicant: QUALCOMM Incorporated, San Diego, CA (US)

(72) Inventors: Kai Chen, Shenzhen (CN); Changlong Xu, Beijing (CN); Liangming Wu, Beijing (CN); Jian Li, Beijing (CN); Hao Xu, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/866,168

(22) Filed: Jul. 15, 2022

(65) Prior Publication Data
US 2022/0360366 A1 Nov. 10, 2022

Related U.S. Application Data

(62) Division of application No. 17/271,746, filed as application No. PCT/CN2019/109815 on Oct. 3, 2019, now Pat. No. 11,411,678.

(30) Foreign Application Priority Data

Oct. 3, 2018 (WO) ................ PCT/CN2018/109240

(51) Int. Cl.
*H04L 1/00* (2006.01)
*H03M 13/13* (2006.01)
(Continued)

(52) U.S. Cl.
CPC .......... *H04L 1/0068* (2013.01); *H03M 13/13* (2013.01); *H03M 13/6306* (2013.01);
(Continued)

(58) Field of Classification Search
CPC ... H04L 1/0068; H04L 1/1819; H04L 1/1854; H04L 1/0041; H04L 1/0045;
(Continued)

(56) References Cited

U.S. PATENT DOCUMENTS

2004/0187070 A1 9/2004 LaBerge
2006/0156163 A1* 7/2006 Berens .................. H04L 1/1845
714/748

(Continued)

FOREIGN PATENT DOCUMENTS

CN 105493424 A 4/2016
CN 107508653 A 12/2017
(Continued)

OTHER PUBLICATIONS

Zhang Y., et al., "A Hybrid ARQ Scheme Based on Equivalent Puncturing Patterns of Polar Codes", 2018 IEEE 88th Vehicular Technology Conference (VTC-Fall), IEEE, Aug. 27, 2018 (Aug. 27, 2018), pp. 1-5, XP033535626, DOI:10.1109/VTCFALL.2018. 8691014 [retrieved on Apr. 12, 2019], Section III.
(Continued)

*Primary Examiner* — Thien Nguyen
(74) *Attorney, Agent, or Firm* — Holland & Hart LLP

(57) ABSTRACT

Wireless devices may use polar codes for encoding transmissions and may support combining transmissions to improve decoding reliability (e.g., by achieving chase combining and incremental redundancy (IR) gains). For example, an encoding device may puncture a set of mother code bits using different puncturing patterns to obtain different redundancy versions for a first transmission and a re-transmission. Each puncturing pattern may correspond to an equivalent decoding performance. In some cases, to obtain equivalent puncture sets, the encoding device may perform punctured index manipulation procedures on an
(Continued)

initial puncturing pattern. A punctured index manipulation procedure may involve switching a binary state for a binary bit at a same binary bit index for each puncture index in a puncturing pattern. A device may receive the transmissions generated using the equivalent puncture sets and may combine the information for improved decoding reliability.

25 Claims, 19 Drawing Sheets

(51) Int. Cl.
  *H03M 13/00* (2006.01)
  *H04L 1/1812* (2023.01)
  *H04L 1/1829* (2023.01)

(52) U.S. Cl.
  CPC ...... *H03M 13/6362* (2013.01); *H04L 1/1819* (2013.01); *H04L 1/1854* (2013.01)

(58) Field of Classification Search
  CPC . H04L 1/0057; H03M 13/13; H03M 13/6306; H03M 13/6362
  See application file for complete search history.

(56) References Cited

U.S. PATENT DOCUMENTS

| | | | |
|---|---|---|---|
| 2009/0177852 A1* | 7/2009 | Chen | H03M 13/658 711/E12.001 |
| 2012/0300626 A1 | 11/2012 | Komura | |
| 2016/0182187 A1 | 6/2016 | Kim et al. | |
| 2016/0285479 A1 | 9/2016 | El-Khamy et al. | |
| 2017/0187396 A1 | 6/2017 | Jeong et al. | |
| 2020/0052819 A1 | 2/2020 | Xu et al. | |
| 2020/0266841 A1* | 8/2020 | Hui | H03M 13/13 |
| 2021/0328718 A1 | 10/2021 | Chen | |

FOREIGN PATENT DOCUMENTS

| | | |
|---|---|---|
| CN | 108282259 A | 7/2018 |
| CN | 108432165 A | 8/2018 |
| WO | WO2015100561 A1 | 7/2015 |
| WO | WO2018072691 A1 | 4/2018 |
| WO | WO2019227276 A1 | 12/2019 |

OTHER PUBLICATIONS

Ericsson: "Rate Matching Schemes for Polar Codes", 3GPP Tsg-Ran WG1 #88bis, 3GPP Draft, R1-1704317, Rate Matching Schemes for Polar Codes, 3rd Generation Partnership Project (3GPP), Mobile Competence Centre, 650, Route Des Lucioles, F-06921 Sophia-Antipolis Cedex, France, vol. RAN WG1, No. Spokane, Apr. 3, 2017-Apr. 7, 2017, Apr. 2, 2017 (Apr. 2, 2017), pp. 1-5, XP051242469, Retrieved from the Internet: URL: http://www.3gpp.org/ftp/Meetings_3GPP_SYNC/RAN1/Docs/, [retrieved on Apr. 2, 2017], The whole document.

Huawei, et al., "Design Aspects of Polar Code and LDPC for NR", 3GPP TSG RAN WG1 Meeting #86bis, R1-1608865, Oct. 14, 2016.

International Preliminary Report on Patentability—PCT/CN2018/109240, The International Bureau of WIPO—Geneva, Switzerland, dated Apr. 15, 2021.

International Preliminary Report on Patentability—PCT/CN2019/109815, The International Bureau of WIPO—Geneva, Switzerland, dated Apr. 15, 2021.

International Search Report and Written Opinion—PCT/CN2018/109240—ISA/EPO—dated Jun. 27, 2019.

International Search Report and Written Opinion—PCT/CN2019/109815—ISA/EPO—dated Dec. 27, 2019.

Supplementary European Search Report—EP19868659—Search Authority—Munich—dated Jun. 3, 2022.

* cited by examiner

EQUIVALENT PUNCTURE SETS FOR POLAR CODED RE-TRANSMISSIONS

CROSS REFERENCES

The present application for patent is a Divisional of U.S. patent application Ser. No. 17/271,746 by CHEN et al., entitled, "EQUIVALENT PUNCTURE SETS FOR POLAR CODED RE-TRANSMISSIONS," filed Feb. 26, 2021, which is a National Stage Entry of International Patent Application No. PCT/CN2019/109815 by CHEN et al., entitled, "EQUIVALENT PUNCTURE SETS FOR POLAR CODED RE-TRANSMISSIONS," filed Oct. 3, 2019, and to International Patent Application No. PCT/CN2018/109240 by Chen et al., entitled "EQUIVALENT PUNCTURE SETS FOR POLAR CODED RE-TRANSMISSIONS," filed Oct. 3, 2018, each of which is assigned to the assignee hereof, and each of which is expressly incorporated by reference in its entirety herein.

BACKGROUND

The following relates generally to wireless communications, and more specifically to polar coded re-transmissions.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform-spread-OFDM (DFT-S-OFDM). A wireless multiple-access communications system may include a number of base stations or network access nodes, each simultaneously supporting communication for multiple communication devices, which may be otherwise known as user equipment (UE).

In some wireless communications systems, wireless devices may utilize error-correcting codes (e.g., polar codes) for encoding transmissions. These devices may also implement combining information from multiple transmissions corresponding to a same mother code to improve decoding. However, in some examples, such a process may require sending identical bits for all re-transmissions of information to guarantee that soft-combining of the transmissions is supported. Accordingly, receiving devices (e.g., UEs) cannot achieve an incremental redundancy (IR) gain from the re-transmissions. In other examples, the decoding complexity may increase for each additional re-transmission, resulting in a large processing overhead for decoding re-transmissions.

SUMMARY

The described techniques relate to improved methods, systems, devices, and apparatuses that support equivalent puncture sets for polar coded re-transmissions. Generally, the described techniques provide for determining hybrid automatic repeat request (HARM) incremental redundancy (IR) transmissions using equivalent puncture sets. For example, in some wireless systems, transmitting devices may use polar codes for encoding transmissions, and receiving devices may combine re-transmissions to improve decoding reliability (e.g., by achieving chase combining and IR gains). A transmitting device may puncture a set of mother code bits using different puncturing patterns to obtain different redundancy versions for a first transmission and a re-transmission. Each puncturing pattern may correspond to an equivalent decoding performance at a receiving device. In some cases, to obtain the equivalent puncture sets, the transmitting device may perform punctured index manipulation procedures on an initial puncturing pattern. A punctured index manipulation procedure may involve switching a binary state for a binary bit at a same binary bit index for each puncture index in a puncturing pattern. In some cases, the transmitting device may determine additional equivalent puncturing patterns by bit flipping a binary bit at a different binary bit index for all of the puncture indices or by flipping a set of binary bits at a same set of binary bit indices for each puncture index. A device may receive the initial transmission and the re-transmission(s) generated using the equivalent puncture sets and may combine the information for improved decoding reliability.

A method for wireless communications is described. The method may include performing an encoding process according to a polar code on a set of information bits to determine a set of coded bits, puncturing bits from the set of coded bits according to a first puncturing pattern to obtain a first subset of the set of coded bits, and transmitting the first subset of the set of coded bits in a first transmission. The method may further include puncturing bits from the set of coded bits according to a second puncturing pattern to obtain a second subset of the set of coded bits, where the second puncturing pattern is derived from the first puncturing pattern, and transmitting the second subset of the set of coded bits in a second transmission.

An apparatus for wireless communications is described. The apparatus may include a processor, memory in electronic communication with the processor, and instructions stored in the memory. The instructions may be executable by the processor to cause the apparatus to perform an encoding process according to a polar code on a set of information bits to determine a set of coded bits, puncture bits from the set of coded bits according to a first puncturing pattern to obtain a first subset of the set of coded bits, and transmit the first subset of the set of coded bits in a first transmission. The instructions may be further executable by the processor to cause the apparatus to puncture bits from the set of coded bits according to a second puncturing pattern to obtain a second subset of the set of coded bits, where the second puncturing pattern is derived from the first puncturing pattern, and transmit the second subset of the set of coded bits in a second transmission.

Another apparatus for wireless communications is described. The apparatus may include means for performing an encoding process according to a polar code on a set of information bits to determine a set of coded bits, puncturing bits from the set of coded bits according to a first puncturing pattern to obtain a first subset of the set of coded bits, and transmitting the first subset of the set of coded bits in a first transmission. The apparatus may further include means for puncturing bits from the set of coded bits according to a second puncturing pattern to obtain a second subset of the set of coded bits, where the second puncturing pattern is derived from the first puncturing pattern, and transmitting the second subset of the set of coded bits in a second transmission.

A non-transitory computer-readable medium storing code for wireless communications is described. The code may include instructions executable by a processor to perform an encoding process according to a polar code on a set of information bits to determine a set of coded bits, puncture bits from the set of coded bits according to a first puncturing pattern to obtain a first subset of the set of coded bits, and transmit the first subset of the set of coded bits in a first transmission. The code may further include instructions executable by the processor to puncture bits from the set of coded bits according to a second puncturing pattern to obtain a second subset of the set of coded bits, where the second puncturing pattern is derived from the first puncturing pattern, and transmit the second subset of the set of coded bits in a second transmission.

In some examples of the method, apparatuses, and non-transitory computer-readable medium described herein, the second subset of the set of coded bits may have an equivalent decoding performance as the first subset of the set of coded bits for the polar code.

Some examples of the method, apparatuses, and non-transitory computer-readable medium described herein may further include operations, features, means, or instructions for determining the second puncturing pattern based on the first puncturing pattern, where determining the second puncturing pattern may include identifying a first set of binary representations for the first puncturing pattern, where each binary representation of the first set of binary representations includes a set of binary bits corresponding to a bit index to puncture according to the first puncturing pattern, flipping, for the each binary representation of the first set of binary representations, a binary state for a bit of the set of binary bits corresponding to a first binary bit index across the first set of binary representations, where the flipping results in a second set of binary representations, and converting the second set of binary representations into the second puncturing pattern.

Some examples of the method, apparatuses, and non-transitory computer-readable medium described herein may further include operations, features, means, or instructions for determining a third puncturing pattern based on the first puncturing pattern, where determining the third puncturing pattern may include flipping, for the each binary representation of the first set of binary representations, a binary state for a different bit of the set of binary bits corresponding to a second binary bit index across the first set of binary representations, where the flipping results in a third set of binary representations, and converting the third set of binary representations into the third puncturing pattern. Some examples of the method, apparatuses, and non-transitory computer-readable medium described herein may further include operations, features, means, or instructions for puncturing bits from the set of coded bits according to the third puncturing pattern to obtain a third subset of the set of coded bits, where the third subset of the set of coded bits may have an equivalent decoding performance as the first subset of the set of coded bits and the second subset of the set of coded bits for the polar code, and transmitting the third subset of the set of coded bits in a third transmission.

Some examples of the method, apparatuses, and non-transitory computer-readable medium described herein may further include operations, features, means, or instructions for determining a third puncturing pattern based on the first puncturing pattern, where determining the third puncturing pattern may include flipping, for the each binary representation of the first set of binary representations, binary states for a set of bits of the set of binary bits corresponding to a first set of binary bit indices across the first set of binary representations, where the flipping results in a third set of binary representations, and converting the third set of binary representations into the third puncturing pattern. Some examples of the method, apparatuses, and non-transitory computer-readable medium described herein may further include operations, features, means, or instructions for puncturing bits from the set of coded bits according to the third puncturing pattern to obtain a third subset of the set of coded bits, where the third subset of the set of coded bits may have an equivalent decoding performance as the first subset of the set of coded bits and the second subset of the set of coded bits for the polar code and transmitting the third subset of the set of coded bits in a third transmission.

Some examples of the method, apparatuses, and non-transitory computer-readable medium described herein may further include operations, features, means, or instructions for determining the first puncturing pattern based on a size of the set of information bits, a size of the set of coded bits, a size of the first subset of the set of coded bits, or a combination thereof.

Some examples of the method, apparatuses, and non-transitory computer-readable medium described herein may further include operations, features, means, or instructions for receiving a negative acknowledgment (NACK) message in response to the first transmission and determining to transmit the second transmission based on the NACK message.

Some examples of the method, apparatuses, and non-transitory computer-readable medium described herein may further include operations, features, means, or instructions for determining to transmit the second transmission based on a pre-configuration or a received configuration message.

A method for wireless communications is described. The method may include receiving, in a first transmission associated with a set of information bits, first information corresponding to a first subset of a set of coded bits, where the first subset of the set of coded bits is based on the set of coded bits and a first puncturing pattern, and receiving, in a second transmission associated with the set of information bits, second information corresponding to a second subset of the set of coded bits, where the second subset of the set of coded bits is based on the set of coded bits and a second puncturing pattern, and where the second puncturing pattern is derived from the first puncturing pattern. The method may further include combining the first information and the second information to obtain combined information for the set of coded bits and performing a decoding process according to a polar code on the combined information.

An apparatus for wireless communications is described. The apparatus may include a processor, memory in electronic communication with the processor, and instructions stored in the memory. The instructions may be executable by the processor to cause the apparatus to receive, in a first transmission associated with a set of information bits, first information corresponding to a first subset of a set of coded bits, where the first subset of the set of coded bits is based on the set of coded bits and a first puncturing pattern, and receive, in a second transmission associated with the set of information bits, second information corresponding to a second subset of the set of coded bits, where the second subset of the set of coded bits is based on the set of coded bits and a second puncturing pattern, and where the second puncturing pattern is derived from the first puncturing pattern. The instructions may be further executable by the processor to combine the first information and the second information to obtain combined information for the set of coded bits and perform a decoding process according to a polar code on the combined information.

Another apparatus for wireless communications is described. The apparatus may include means for receiving, in a first transmission associated with a set of information bits, first information corresponding to a first subset of a set of coded bits, where the first subset of the set of coded bits is based on the set of coded bits and a first puncturing pattern, and receiving, in a second transmission associated with the set of information bits, second information corresponding to a second subset of the set of coded bits, where the second subset of the set of coded bits is based on the set of coded bits and a second puncturing pattern, and where the second puncturing pattern is derived from the first puncturing pattern. The apparatus may further include means for combining the first information and the second information to obtain combined information for the set of coded bits and performing a decoding process according to a polar code on the combined information.

A non-transitory computer-readable medium storing code for wireless communications is described. The code may include instructions executable by a processor to receive, in a first transmission associated with a set of information bits, first information corresponding to a first subset of a set of coded bits, where the first subset of the set of coded bits is based on the set of coded bits and a first puncturing pattern, and receive, in a second transmission associated with the set of information bits, second information corresponding to a second subset of the set of coded bits, where the second subset of the set of coded bits is based on the set of coded bits and a second puncturing pattern, and where the second puncturing pattern is derived from the first puncturing pattern. The code may further include instructions executable by the processor to combine the first information and the second information to obtain combined information for the set of coded bits and perform a decoding process according to a polar code on the combined information.

In some examples of the method, apparatuses, and non-transitory computer-readable medium described herein, the second subset of the set of coded bits may have an equivalent decoding performance as the first subset of the set of coded bits for the polar code. Some examples of the method, apparatuses, and non-transitory computer-readable medium described herein may further include operations, features, means, or instructions for determining the set of information bits based on the decoding process.

Some examples of the method, apparatuses, and non-transitory computer-readable medium described herein may further include operations, features, means, or instructions for determining the second puncturing pattern based on the first puncturing pattern, where determining the second puncturing pattern may include identifying a first set of binary representations for the first puncturing pattern, where each binary representation of the first set of binary representations includes a set of binary bits corresponding to a bit index to puncture according to the first puncturing pattern, flipping, for the each binary representation of the first set of binary representations, a binary state for a bit of the set of binary bits corresponding to a first binary bit index across the first set of binary representations, where the flipping results in a second set of binary representations, and converting the second set of binary representations into the second puncturing pattern.

Some examples of the method, apparatuses, and non-transitory computer-readable medium described herein may further include operations, features, means, or instructions for determining a third puncturing pattern based on the first puncturing pattern, where determining the third puncturing pattern may include flipping, for the each binary representation of the first set of binary representations, a binary state for a different bit of the set of binary bits corresponding to a second binary bit index across the first set of binary representations, where the flipping results in a third set of binary representations, and converting the third set of binary representations into the third puncturing pattern. Some examples of the method, apparatuses, and non-transitory computer-readable medium described herein may further include operations, features, means, or instructions for receiving, in a third transmission associated with the set of information bits, third information corresponding to a third subset of the set of coded bits, where the third subset of the set of coded bits may be based on the set of coded bits and the third puncturing pattern, and where the third subset of the set of coded bits may have an equivalent decoding performance as the first subset of the set of coded bits and the second subset of the set of coded bits for the polar code, combining the first information, the second information, and the third information to obtain second combined information for the set of coded bits, and performing a second decoding process according to the polar code on the second combined information.

Some examples of the method, apparatuses, and non-transitory computer-readable medium described herein may further include operations, features, means, or instructions for determining a third puncturing pattern based on the first puncturing pattern, where determining the third puncturing pattern may include flipping, for the each binary representation of the first set of binary representations, binary states for a set of bits of the set of binary bits corresponding to a first set of binary bit indices across the first set of binary representations, where the flipping results in a third set of binary representations, and converting the third set of binary representations into the third puncturing pattern. Some examples of the method, apparatuses, and non-transitory computer-readable medium described herein may further include operations, features, means, or instructions for receiving, in a third transmission associated with the set of information bits, third information corresponding to a third subset of the set of coded bits, where the third subset of the set of coded bits may be based on the set of coded bits and the third puncturing pattern, and where the third subset of the set of coded bits may have an equivalent decoding performance as the first subset of the set of coded bits and the second subset of the set of coded bits for the polar code, combining the first information, the second information, and the third information to obtain second combined information for the set of coded bits, and performing a second decoding process according to the polar code on the second combined information.

Some examples of the method, apparatuses, and non-transitory computer-readable medium described herein may further include operations, features, means, or instructions for determining the first puncturing pattern based on a size of the set of information bits, a size of the set of coded bits, a size of the first subset of the set of coded bits, or a combination thereof.

In some examples of the method, apparatuses, and non-transitory computer-readable medium described herein, combining the first information and the second information to obtain the combined information may include operations, features, means, or instructions for soft-combining a first set of log-likelihood ratios (LLRs) corresponding to the first information with a second set of LLRs corresponding to the second information to obtain a combined set of LLRs corresponding to the combined information. In some examples of the method, apparatuses, and non-transitory computer-readable medium described herein, soft-combining the first set of LLRs corresponding to the first information with the second set of LLRs corresponding to the second information further may include operations, features, means, or instructions for adding LLRs from the first set of LLRs to LLRs from the second set of LLRs that correspond to same bits of the set of coded bits.

Some examples of the method, apparatuses, and non-transitory computer-readable medium described herein may further include operations, features, means, or instructions for performing an unsuccessful decoding process according to the polar code on the first information, where performing the decoding process according to the polar code on the combined information may be based on the unsuccessful decoding process.

Some examples of the method, apparatuses, and non-transitory computer-readable medium described herein may further include operations, features, means, or instructions for transmitting a NACK message in response to the first transmission based on the unsuccessful decoding process, where the second transmission may be received based on the NACK message.

DETAILED DESCRIPTION

Figure 1:
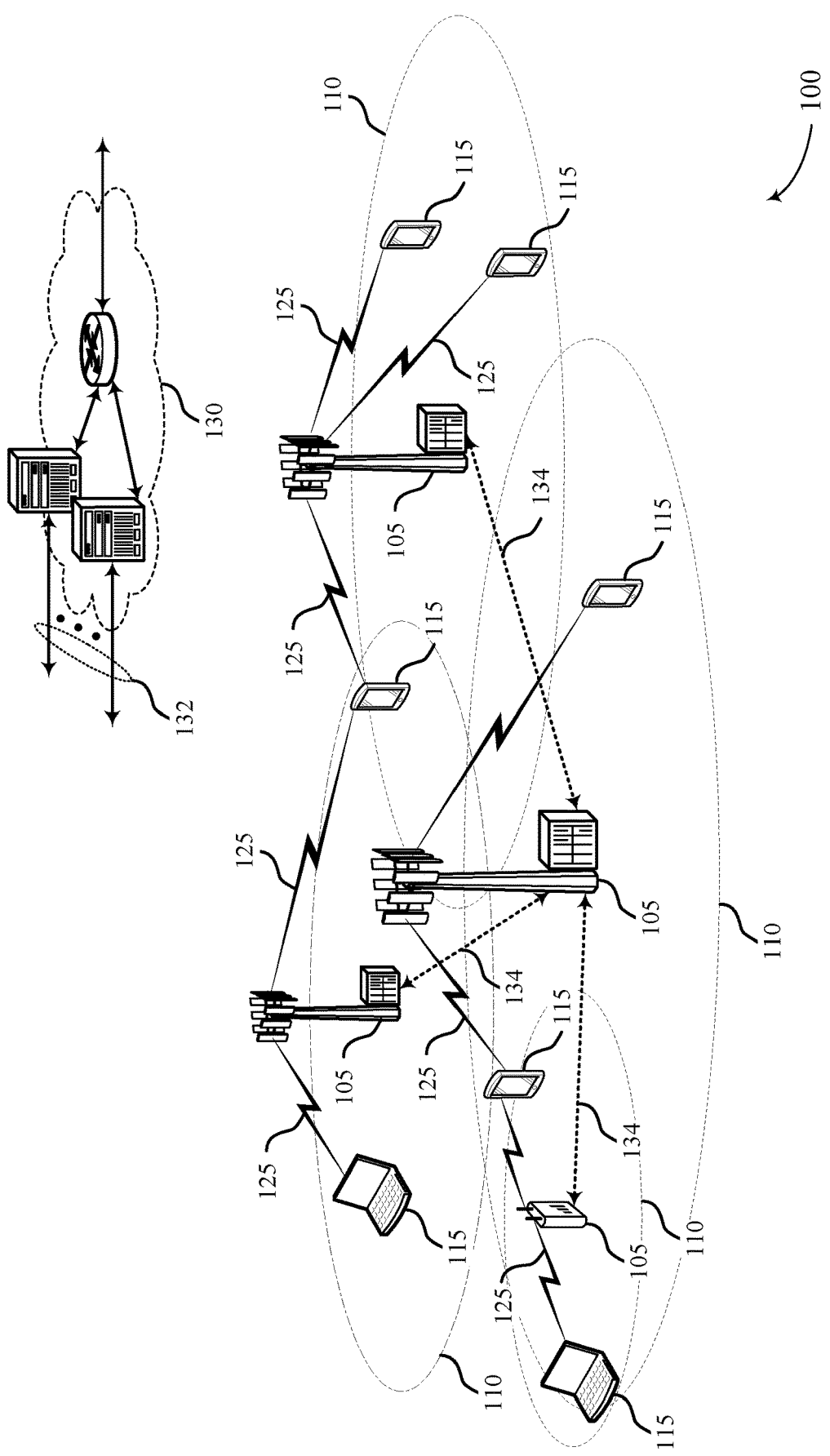
FIGS. 1 and 2 illustrate examples of wireless communications systems that support equivalent puncture sets for polar coded re-transmissions in accordance with aspects of the present disclosure.

In some wireless communications systems, wireless devices (e.g., base stations and user equipment (UEs)) may encode transmissions using an error-correcting code, such as a polar code. The wireless devices may additionally transmit one or more polar encoded re-transmissions for a same set of coded bits. To support incremental redundancy (IR) at a receiving device, an encoding device may use a different puncturing pattern for a re-transmission than was used for the initial transmission. As such, the initial transmission and the re-transmission may be different redundancy versions for the coded bits. A device receiving the transmissions may jointly decode the different redundancy versions to improve the decoding reliability.

For example, a base station may determine a set of information bits to transmit to a UE. The base station may encode the information bits according to a polar code to obtain a set of coded bits (i.e., mother code bits). The base station may determine an initial puncturing pattern to use for a first transmission of the coded bits, where the puncturing pattern indicates bits of the set of coded bits to remove from the first transmission. The base station may transmit the punctured set of coded bits in a first transmission to the UE. The UE receiving the transmission may identify the first puncturing pattern used to generate the first transmission and may determine information about the set of coded bits based on this puncturing pattern. For example, the UE may determine log-likelihood ratios (LLRs) for a subset of the coded bits corresponding to the bits included in the first transmission. The UE may attempt to decode the first transmission based on this set of LLRs. However, in some cases, the UE may not successfully determine the information bits from this decoding process.

In these cases, the base station may determine to re-transmit information for the set of coded bits. For example, the base station may receive a negative acknowledgment (NACK) message from the UE in response to the first transmission (e.g., as part of a hybrid automatic repeat request (HARQ) procedure). The base station may determine a second puncturing pattern that is "equivalent" to the first puncturing pattern. Equivalent puncture sets refers to puncturing patterns that result in codewords with the same or similar (e.g., within a threshold block error rate (BLER) difference) decoding performances. In some implementations, to determine the second puncturing pattern, the base station may perform a punctured index manipulation procedure. The punctured index manipulation procedure may involve the base station identifying binary representations for each puncture index included in the first puncturing pattern. The base station may manipulate the indices for each puncture index. For example, the base station may flip the binary state for one or more bits in each binary representation, where the flipped bits correspond to the same binary bit index or indices within each binary representation. The resulting set of binary representations with flipped bits may correspond to the second puncturing pattern, where this second puncturing pattern is equivalent to the first puncturing pattern based on the punctured index manipulation procedure. The base station may puncture the set of coded bits using the second puncturing pattern and may transmit this punctured set of coded bits in a second transmission (i.e., a re-transmission) to the UE. The UE may receive the second transmission and may combine the information from the second transmission with the information from the first transmission to determine combined information for decoding. For example, by mapping the LLRs for the two received transmissions to the coded set of bits and adding any coinciding LLRs, the UE may achieve both chase combining and IR gains for the decoding process. Based on the combined set of information, the UE may reliably determine the encoded information bits.

Aspects of the disclosure are initially described in the context of wireless communications systems. Additional aspects of the disclosure are described with respect to a device for encoding and decoding, an encoding process, a punctured index manipulation procedure, and a process flow. Aspects of the disclosure are further illustrated by and described with reference to apparatus diagrams, system diagrams, and flowcharts that relate to equivalent puncture sets for polar coded re-transmissions.

FIG. 1 illustrates an example of a wireless communications system 100 that supports equivalent puncture sets for polar coded re-transmissions in accordance with aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation Node B or giga-nodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up only a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1, N2, N3, or other interface). Base stations 105 may communicate with one another over backhaul links 134 (e.g., via an X2, Xn, or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 MHz to 300 GHz. Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that can tolerate interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a carrier aggregation (CA) configuration in conjunction with component carriers (CCs) operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving devices are equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105. Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a highest signal strength, highest signal-to-noise ratio, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use HARQ to provide re-transmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical (PHY) layer, transport channels may be mapped to physical channels.

In some cases, UEs 115 and base stations 105 may support re-transmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and re-transmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200$ $T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases, a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an E-UTRA absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as OFDM or DFT-s-OFDM).

The organizational structure of the carriers may be different for different radio access technologies (e.g., LTE, LTE-A, LTE-A Pro, NR, etc.). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs 115 that can support simultaneous communications via carriers associated with more than one different carrier bandwidth.

Wireless communications system 100 may support communication with a UE 115 on multiple cells or carriers, a feature which may be referred to as CA or multi-carrier operation. A UE 115 may be configured with multiple downlink CCs and one or more uplink CCs according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other CCs, which may include use of a reduced symbol duration as compared with symbol durations of the other CCs. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications systems such as an NR system may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across the frequency domain) and horizontal (e.g., across the time domain) sharing of resources.

In some wireless communications systems 100, wireless devices (e.g., base stations 105 and UEs 115) may encode transmissions using an error-correcting code, such as a polar code. The wireless devices may additionally transmit one or more polar encoded re-transmissions for a same set of coded bits. To support IR at a receiving device, an encoding device may use a different puncturing pattern for a re-transmission as the puncturing pattern used for the initial transmission. As such, the initial transmission and the re-transmission may be different redundancy versions for the coded bits. A device receiving the transmissions may jointly decode the different redundancy versions to improve the decoding reliability.

For example, a base station 105 may determine a set of information bits to transmit to a UE 115. The base station 105 may encode the information bits according to a polar code to obtain a set of coded bits (i.e., mother code bits). The base station 105 may determine an initial puncturing pattern to use for a first transmission of the coded bits, where the puncturing pattern indicates bits of the set of coded bits to remove from the first transmission. The base station 105 may transmit the punctured set of coded bits in a first transmission to the UE 115. The UE 115 receiving the transmission may identify the first puncturing pattern used to generate the first transmission and may determine information about the set of coded bits based on this puncturing pattern. For example, the UE 115 may determine LLRs for a subset of the coded bits corresponding to the bits included in the first transmission. The UE 115 may attempt to decode the first transmission based on this set of LLRs. However, in some cases, the UE 115 may not successfully determine the information bits based on this decoding process.

In these cases, the base station 105 may determine to re-transmit information for the set of coded bits. For example, the base station 105 may receive a NACK message from the UE 115 in response to the first transmission (e.g., as part of a HARQ procedure). The base station 105 may determine a second puncturing pattern that is "equivalent" to the first puncturing pattern. Equivalent puncture sets may refer to puncturing patterns that result in codewords with the same or similar (e.g., within a threshold BLER difference) decoding performances. In some implementations, to determine the second puncturing pattern, the base station 105 may perform a punctured index manipulation procedure (e.g., bit flipping procedure). The punctured index manipulation procedure may involve the base station 105 identifying binary representations for each puncture index included in the first puncturing pattern and manipulating the binary state for one or more bits in each binary representation. In some cases, the manipulated bits correspond to the same binary bit index or indices within each binary representation. The resulting set of binary representations with manipulated bits may correspond to the second puncturing pattern equivalent to the first puncturing pattern. The base station 105 may puncture the set of coded bits using the second puncturing pattern and may transmit this punctured set of coded bits in a second transmission (i.e., a re-transmission) to the UE 115. The UE 115 may receive the second transmission and may combine the information from the second transmission with the information from the first transmission to determine combined information for decoding. For example, by mapping the LLRs for the two received transmissions to the coded set of bits and additively combining any coinciding LLRs, the UE 115 may achieve both chase combining and IR gains for the decoding process. Based on the combined set of information, the UE 115 may reliably determine the encoded information bits sent by the base station 105.

Figure 2:
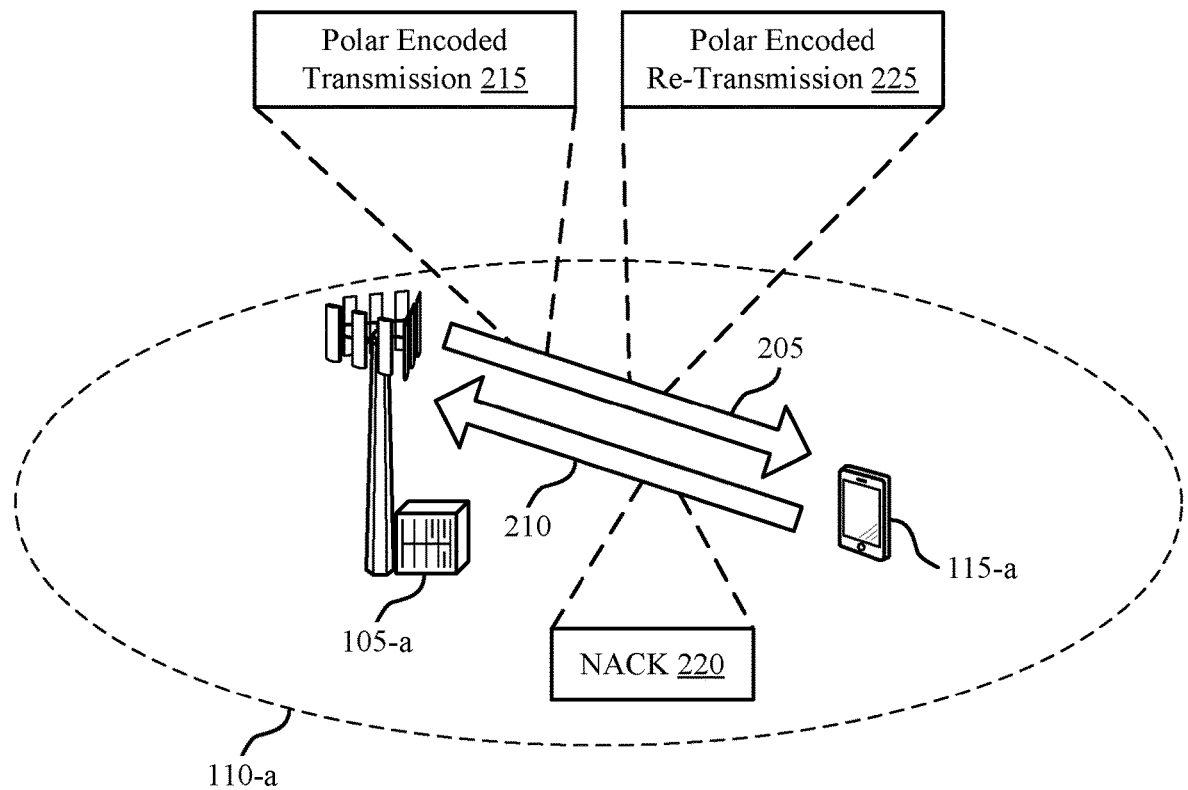

FIG. 2 illustrates an example of a wireless communications system 200 that supports equivalent puncture sets for polar coded re-transmissions in accordance with aspects of the present disclosure. The wireless communications system 200 may be an example of a wireless communications system 100 as described with reference to FIG. 1. The wireless communications system 200 may include base station 105-a and UE 115-a, which may be examples of the corresponding devices described with reference to FIG. 1. Base station 105-a may provide network coverage for geographic coverage area 110-a and may communicate with UE 115-a. For example, base station 105-a may transmit control information and data to UE 115-a on the downlink 205 channel. In some cases, base station 105-a may encode a transmission (e.g., a physical downlink control channel (PDCCH) transmission) using an error-correcting code, such as a polar code, and may transmit the polar encoded transmission 215 on the downlink 205 channel to UE 115-a. Base station 105-a may additionally transmit one or more polar encoded re-transmissions 225 to UE 115-a (e.g., based on receiving a NACK 220 on the uplink 210 channel). By implementing puncturing patterns for the polar encoded transmission 215 and any polar encoded re-transmissions 225 with equivalent or similar decoding performances at UE 115-a, base station 105-a may improve the decoding reliability for the encoded information while maintaining consistent decoding complexity across re-transmissions. Although described with base station 105-a performing encoding and UE 115-a performing decoding, it is to be understood that in some cases UE 115-a may perform the encoding processes and base station 105-a may perform the decoding processes. Additionally or alternatively, the encoding and decoding techniques described herein may be implemented for sidelink or backhaul communications.

In some systems (e.g., systems operating in a fifth generation (5G) eMBB scenario), base stations 105 and UEs 115 may handle encoding and decoding particular transmissions using polar codes. A polar code may indicate the most reliable bit indices or bit channels (e.g., based on simulated or calculated reliability metrics) after a channel polarization transform and may carry information bits on this set of most reliable bit indices or channels. In some cases, the bits carrying information may be referred to as "active" bits, while the remaining bits (e.g., bits set to a pre-determined value known at both an encoder and decoder) may be referred to as "nonactive" bits or frozen bits. Base station 105-a may determine the set of information bits for transmission to UE 115-a. These information bits may include payload bits corresponding to data bits, control information (e.g., downlink control information (DCI)), or any other information for wireless transmission between devices. The information bits may also include error checking bits for improved decoding performance. Base station 105-a may polar encode the set of information bits to obtain a set of coded bits, referred to as mother code bits. The size of the set of mother code bits (i.e., the mother code length) may be a power of two based on the polar encoding process. Base station 105-a may use this set of coded bits to transmit the information to UE 115-a in one or more polar encoded transmissions 215.

However, rather than transmit the entire set of coded bits, base station 105-a may transmit a codeword with a practical code length that may be different than the mother code length. This practical code length may be referred to as the resource size, M, for the polar encoded transmission 215. In some cases, the practical code length for the coded bits for transmission may be selected arbitrarily by the base station 105-a. For example, the practical code length may be based on pre-configured values corresponding to different aggregation levels. In one specific example, for a PDCCH transmission, base station 105-a may transmit a codeword of size 108 bits when implementing an aggregation level of 1, 216 bits when implementing an aggregation level of 2, 432 bits when implementing an aggregation level of 4, 864 bits when implementing an aggregation level of 8, and 1728 bits when implementing an aggregation level of 16. Base station 105-a may perform rate-matching (e.g., using a rate-matching module) to adjust the codeword from the mother code length to the practical code length. Rate-matching may involve puncturing (e.g., removing bits from the set of mother code bits to obtain a subset of coded bits for transmission), shortening (e.g., shortening a generator matrix such that the resulting code structure is shortened), repetition (e.g., repeating one or more bits of the set of mother code bits to obtain a set of bits for transmission with a length greater than the mother code length), or some combination of these techniques. In some cases, the mother code length, the reliable bit indices for information, or both may be based on the practical code length for transmission (e.g., the resource size M, which in turn may be based on an aggregation level for the channel), the number of information bits for transmission (e.g., the payload size K), or a combination thereof.

In the wireless communications system 200, base station 105-a may use bit puncturing to obtain the subset of coded bits for transmission from the set of mother code bits. Base station 105-a may determine a puncturing pattern based on the number of information bits, the mother code length, the practical code length, or some combination of these values. The puncturing pattern may be an example of a list or array of bit indices. When puncturing the set of coded bits using the puncturing pattern, base station 105-a may determine a subset of the set of coded bits by removing the bits from the coded bits corresponding to the bit indices of the puncturing pattern. Base station 105-a may transmit this punctured set of bits (i.e., the subset of the set of coded bits) as a polar encoded transmission 215 on the downlink 205 channel to UE 115-a.

UE 115-a may receive the polar encoded transmission 215 and may attempt to decode the information contained in the transmission. In some cases, UE 115-a may fail to decode the polar encoded transmission 215 (e.g., due to poor channel quality, consistent or bursty interference on the channel, etc.). To improve the reliability of the polar decoding process at UE 115-a, base station 105-a may transmit a polar encoded re-transmission 225 on the downlink 205 channel. In some cases, base station 105-a may automatically send the polar encoded re-transmission 225 based on a configuration of base station 105-a (e.g., based on a channel quality measurement at the base station 105-a). In other cases, when UE 115-a fails to successfully decode the polar encoded transmission 215, UE 115-a may transmit a NACK 220 on the uplink 210 channel to base station 105-a (e.g., as part of a HARQ process for the polar encoded transmission 215), and the NACK may trigger base station 105-a to re-transmit the information. The polar encoded transmission 215 and the polar encoded re-transmission 225 may support soft-combining at UE 115-a, which can achieve an IR gain at UE 115-a for the decoding process.

Base station 105-a may use a same set of mother code bits for selecting the codewords for the polar encoded transmission 215 and the polar encoded re-transmission 225 in order to support soft-combining, as the coded bits for different mother codes may not support soft-combining at a receiving device (e.g., even if the different mother codes are determined from a same set of information bits). However, base station 105-a may use different puncturing patterns for the polar encoded transmission 215 and the polar encoded re-transmission 225 to support multiple redundancy versions for joint decoding. For example, base station 105-a may determine additional puncturing patterns based on the first puncturing pattern that may be used to generate polar encoded re-transmissions 225. These additional puncturing patterns may be "equivalent" puncturing patterns (e.g., equivalent puncture sets) to the first puncturing pattern, where bit puncturing using "equivalent" puncturing patterns results in subsets of the coded bits with equivalent decoding performances at a receiving device (e.g., UE 115-a).

In one specific example, base station 105-a may implement a punctured index manipulation procedure to determine "equivalent" puncturing patterns to the first puncturing pattern. In the punctured index manipulation procedure, base station 105-a may convert each bit index in the puncturing pattern into a binary representation. Base station 105-a may then manipulate (e.g., flip) the binary state for at least one bit in each binary representation, where the flipped bit or bits correspond to the same binary bit index or indices across the binary representations. For example, for a mother code length of 256 (e.g., the eighth power of two), the puncturing pattern may contain any values between 0 and 255, inclusive. These values translated into binary representations may contain any binary values between {00000000} and {11111111}, inclusive, where each binary representation contains eight binary digits (e.g., corresponding to the eighth power of two for the mother code length). Manipulating a bit may include changing the binary state (e.g., from a 0 bit value to a 1 bit value or from a 1 bit value to a 0 bit value) for one bit at a selected binary digit. For example, base station 105-a may flip the bit corresponding to the fifth binary digit to obtain a new binary representation and may convert this new binary representation back into decimal form to determine a second puncturing pattern equivalent to the first puncturing pattern. Manipulating one or more bits may also include performing a logical operation or set of logical operations on the bits of the punctured indices for the puncturing pattern. As no binary digits are added or removed during the punctured index manipulation procedure, the resulting puncturing pattern also contains values between 0 and 255. In some cases, another device may perform the punctured index manipulation procedure, and base station 105-a may store one or more sets of equivalent puncturing patterns based on the punctured index manipulation procedure. For example, the punctured index manipulation procedure may be performed offline to determine the sets of equivalent puncturing patterns, and base station 105-a may be configured with the sets of equivalent puncturing patterns (e.g., when deploying the base station 105-a).

Base station 105-a may puncture the set of coded bits (i.e., the mother code bits) using the second puncturing pattern equivalent to the first puncturing to determine a second subset of the set of coded bits. Base station 105-a may transmit this punctured set of bits (i.e., the second subset of the set of coded bits) as a polar encoded re-transmission 225 on the downlink 205 channel to UE 115-a. UE 115-a may receive the polar encoded re-transmission 225 and may combine information from the polar encoded re-transmission 225 with information received in the polar encoded transmission 215. For example, UE 115-a may determine LLRs for each of the transmissions and may combine the LLRs to determine a combined set of LLRs. Combining the LLRs may involve UE 115-a fitting received LLRs to the same mother code according to the different puncturing patterns and adding LLRs from the different transmissions together that map to the same mother code bit. UE 115-a may use these combined LLRs for the polar decoding process. In some cases, based on the combined information, UE 115-a may successfully decode the transmissions and may determine the set of information bits encoded in the transmissions.

Some systems may implement chase combining procedures without different puncture sets for polar encoded re-transmissions. If bit puncturing is performed for HARQ with chase combining, the encoding device may use a puncture set for the first transmission and may use the same puncture set for each re-transmission (e.g., resulting in transmitting the same codeword twice). In this way, the input LLRs for each transmission correspond to the same bits in the mother code, supporting chase combining at the decoding device. However, the re-transmissions do not provide any information about other bits in the mother code to the decoding device. As such, HARQ with chase combining may not achieve any IR gain at the decoding device.

Other systems may implement an active-bit relocation under masks (ARUM) procedure without equivalent puncture sets to determine different redundancy versions for re-transmission. However, the decoding complexity for transmissions obtained using ARUM may increase with each additional re-transmission. For example, decoding a transmission based on a mother code of length N and an ARUM procedure involves decoding a code of length N. Decoding the first re-transmission based on this mother code of length N and the ARUM procedure involves decoding a code of length 2N. The decoding complexity may continue to increase in a similar manner for each further re-transmission using ARUM. Additionally, if the signal-to-noise ratio (SNR) for the channel changes significantly between the initial transmission and one or more of the re-transmissions (e.g., by more than a threshold value, such as 5 decibels (dB), 10 dB, etc.), the decoding performance at the decoding device may deteriorate. For example, an SNR for the channel of −3 dB for the first transmission and +3 dB for the second transmission (i.e., the first re-transmission) may result in a relatively high BLER for decoding (e.g., corresponding to significant deterioration in the decoding performance).

In contrast, the wireless communications system 200 implementing equivalent puncture sets for re-transmission may support IR gains and robust decoding performance despite changes in the SNR. For example, using equivalent puncture sets for each polar encoded re-transmission may support HARQ with IR. A decoding device (e.g., UE 115-a) jointly decoding the first transmission and a re-transmission may combine information from the two transmissions to determine information about additional mother code bits than were indicated in just the first transmission (e.g., due to the first transmission and the re-transmission being different redundancy versions generated using different puncturing sets). This may improve the decoding performance (e.g., the BLER) at the decoding device. Furthermore, as the first puncturing pattern for the polar code may be selected or determined to optimize decoding performance of the first transmission, determining additional puncturing patterns with the same or similar (e.g., within a threshold BLER value) decoding performances may further optimize the re-transmissions.

Additionally, the wireless communications system 200 implementing equivalent puncture sets may be robust to varying SNR values between transmissions. For example, the decoding performance may not significantly deteriorate if the SNR for the channel changes significantly (e.g., by more than a threshold value, such as 5 dB, 10 dB, etc.) from the first transmission to the second transmission (i.e., the first re-transmission). As such, implementing equivalent puncture sets for re-transmission may result in a lower BLER for decoding transmissions sent over channels with relatively large differences in SNRs than implementing chase combining or ARUM procedures. Additionally, the decoding complexity for decoding each re-transmission may stay consistent (i.e., not increase with the number of re-transmissions), as the decoding process involves decoding a code of length N for the first transmission and each successive re-transmission. In the specific example of using punctured index manipulation to determine equivalent puncture sets, the encoding device (e.g., base station 105-a) may incur a relatively low encoding complexity when identifying the equivalent puncture sets.

Figure 3:
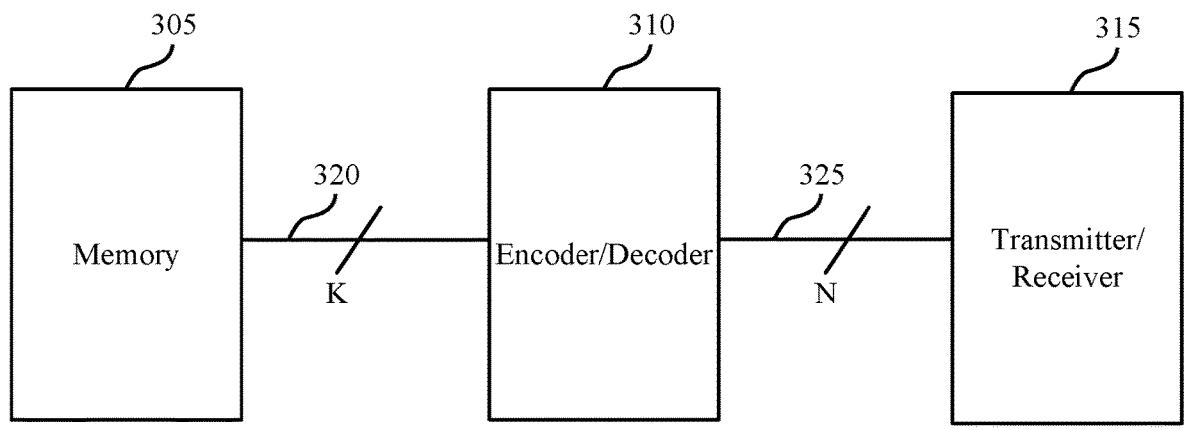
FIG. 3 illustrates an example of a device that supports equivalent puncture sets for polar coded re-transmissions in accordance with aspects of the present disclosure.

FIG. 3 illustrates an example of a device 300 that supports equivalent puncture sets for polar coded re-transmissions in accordance with aspects of the present disclosure. In some examples, device 300 may be implemented by aspects of a wireless communications system 100 or 200. The device 300 may be any device within a wireless communications system that performs an encoding or decoding process (e.g., using an error-correcting code, such as a polar code). For example, device 300 may be an example of a UE 115 or a base station 105 as described with reference to FIGS. 1 and 2.

As illustrated, device 300 may include a memory 305, an encoder/decoder 310, and a transmitter/receiver 315. First bus 320 may connect memory 305 to encoder/decoder 310 and second bus 325 may connect encoder/decoder 310 to transmitter/receiver 315. In some cases, device 300 may have data stored in memory 305 to be transmitted to another device, such as a UE 115 or base station 105. To initiate the transmission process, device 300 may retrieve from memory 305 the data for transmission. For a PDCCH transmission, the data for transmission may include downlink control data for a UE 115 or a set of UEs 115. The data may include a number of payload bits, 'A,' which may be 1s or 0s, provided from memory 305 to encoder/decoder 310 via first bus 320. In some cases, these payload bits may be combined with a number of error checking bits (e.g., CRC bits), 'C,' to form a total set of information bits, 'A+C.' The number of information bits may be represented as a value 'K,' as shown (e.g., K=A+C). For PDCCH transmissions, this number of information bits, K, or the number of payload bits, A, may be based on the selected DCI format. The encoder/decoder 310 may implement a polar code with a block length, 'N,' for encoding the information bits, where N may be different than or the same as K. Such a polar code may be referred to as an (N, K) polar code. In some cases, the bits not allocated as information bits (e.g., N–K bits) may be assigned as frozen bits. Frozen bits may be bits with a default value known to both the encoding and decoding devices 300 (e.g., bits with a default bit value of 0).

The encoder 310 may perform the polar encoding process on the K information bits to determine a set of coded bits, referred to as mother code bits, of length N. The number of mother code bits, N, in this resulting mother code may be a power of 2 to support the polar encoding process. Some possible mother code sizes include N=32, 64, 128, 256, 512, or 1024 bits. However, the transmitter 315 may transmit a set of coded bits with a size, 'M,' that can be different from the size of the set of polar encoded bits in the mother code, N. In some cases, the number of coded bits for transmission is based on an aggregation level for the transmission. The encoder 310 may select the number of mother code bits N and a corresponding polar code of block length N based on the determined aggregation level, the number of information bits for transmission, or both.

If the set of coded bits to transmit is smaller than the total set of coded bits (i.e., if M<N), the encoder 310 or transmitter 315 may perform bit puncturing. Bit puncturing may involve determining a puncture set or puncturing pattern indicating one or more bit indices and removing the bits from the set of coded bits positioned at these bit indices for transmission. The resulting subset of coded bits may be transmitted by the transmitter 315 to a receiving device 300.

In some cases, the transmitter 315 may additionally transmit a number of re-transmissions of the encoded information bits to the receiving device 300. The device 300 may re-transmit the information based on receiving a NACK message from the receiving device, based on not receiving an ACK message from the receiving device (e.g., during a monitoring window), or based on a configuration of the device 300. For example, some devices 300 may automatically transmit one or more re-transmissions for a same set of information bits for improved reliability. In some cases, this automatic re-transmission may be based on the channel conditions (e.g., if a channel quality is below a certain channel quality threshold, the device 300 may automatically re-transmit encoded information bits). The device 300 may transmit a different subset of the coded bits in the second transmission than in the first transmission to achieve IR gains at the receiving device 300. For example, the device 300 may determine a different puncture set or puncturing pattern for the second transmission than for the first transmission. In some cases, the device 300 may perform a punctured index manipulation procedure to determine an equivalent puncturing pattern to the first puncturing pattern (e.g., a puncturing pattern resulting in an equivalent decoding performance) to use for the second transmission. In some cases, the device 300 may perform bit flipping to determine different puncturing patterns when encoding or transmitting re-transmissions. In other cases, the device 300 may store a lookup table in memory 305 containing sets of equivalent puncturing patterns to use for different re-transmissions (e.g., where each puncturing pattern stored in the table corresponds to a different combination of K, N, M, and transmission number, or some subset of these parameters). Based on the specific puncturing patterns, this re-transmission technique may support both chase combining and IR at a receiving device 300. The transmitter 315 may transmit the first transmission and the re-transmission(s) to the receiving device 300, and the receiving device 300 may receive the transmissions at a receiver 315 and may pass the received information along to a decoder 310 for polar decoding.

In some wireless systems, encoder/decoder 310 may be an example of a successive cancellation (SC) or a successive cancellation list (SCL) decoder. A UE 115 or base station 105 may receive a transmission including a codeword at receiver 315 and may send the transmission to the SCL decoder (e.g., encoder/decoder 310). The SCL decoder may determine input LLRs for the bit channels of the received codeword. During decoding, the SCL decoder may determine decoded LLRs based on these input LLRs, where the decoded LLRs correspond to each bit channel of the polar code. These decoded LLRs may be referred to as bit metrics. In some cases, if the LLR is zero or a positive value, the SCL decoder may determine the corresponding bit is a 0 bit, and a negative LLR may correspond to a 1 bit. The SCL decoder may use the bit metrics to determine the decoded bit values.

The SCL decoder may employ multiple concurrent SC decoding processes. Each SC decoding process may decode the codeword sequentially (e.g., in order of the bit channel indices, in the U-domain). Due to the combination of multiple SC decoding processes, the SCL decoder may calculate multiple decoding path candidates. For example, an SCL decoder of list size 'L'; (i.e., the SCL decoder has L SC decoding processes) may calculate L decoding path candidates, and a corresponding reliability metric (e.g., a path metric) for each decoding path candidate. The path metric may represent a reliability of a decoding path candidate or a probability that the corresponding decoding path candidate is the correct set of decoded bits. The path metric may be based on the determined bit metrics and the bit values selected at each bit channel. The SCL decoder may have a number of levels equal to the number of bit channels in the mother code length. At each level (e.g., for information bits), each decoding path candidate may select either a 0 bit or a 1 bit based on a path metric of the 0 bit and the 1 bit. The SCL decoder may select a decoding path candidate based on the path metrics and may output the bits corresponding to the selected decoding path as the decoded sets of bits. For example, the SCL decoder may select the decoding paths with the highest path metrics for error checking, and the decoder 310 may determine a successfully decoded path candidate based on a result of the error checking process.

In some cases, the decoder 310 (e.g., an SC or SCL decoder) may support soft-combining of transmissions for improved decoding. For example, if a transmitter/receiver 315 of a device 300 receives one or more re-transmissions for the same set of information bits using the same set of coded bits (i.e., the same mother code), the transmitter/receiver 315 or decoder 310 may combine information received in the original transmission and any number of the re-transmissions to improve the likelihood of successfully decoding the information bits. This combining of information may involve soft-combining the input LLRs for the different transmissions to determine a set of combined LLRs. Combining the LLRs may involve the receiving device 300 identifying the puncturing patterns used for each of the transmissions. In some cases, determining the puncturing patterns may involve determining equivalent puncturing patterns using a punctured index manipulation procedure or using a lookup table in memory 305, where the puncturing patterns stored in the lookup table were initially generated based on a punctured index manipulation procedure. If a first transmission and a re-transmission include different subsets of the coded bits (e.g., due to the transmitting device 300 using two different puncture sets or puncturing patterns for the transmissions), the receiver 315 or decoder 310 may determine LLRs for a greater number of bits than the M transmitted bits. That is, if N>M>N/2, with a single re-transmission and based on the specific puncturing sets, a receiving device 300 may determine input LLRs for the entire set of coded bits of size N (or at least for a set of X bits, where N≥X>M). The receiving device 300 may additionally determine more reliable input LLRs for at least a portion of the bits due to chase combining. For example, if the receiver 315 receives input LLRs for bit channels corresponding to a same bit of the set of coded bits in the transmissions, the receiver 315 may add the two input LLRs to determine a more reliable combined input LLR, and the decoder 310 may use the more reliable combined input LLR for polar decoding. The decoder 310 may determine the set of information bits based on combining the information received in the original transmission with information received in one or more re-transmissions, and in some cases may store this received set of information bits of size K in the memory 305.

Figure 4:
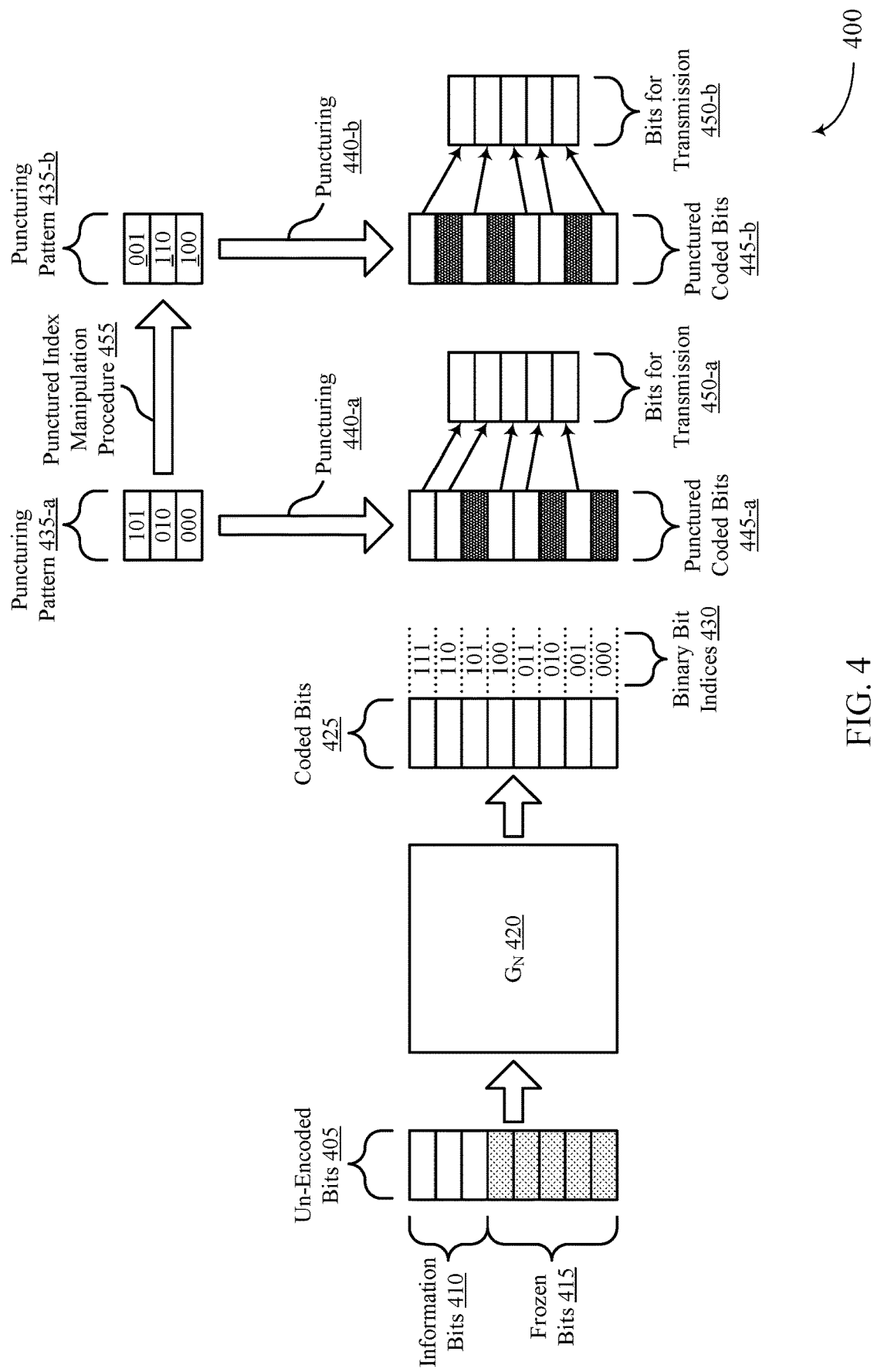
FIG. 4 illustrates an example of an encoding process that supports equivalent puncture sets for polar coded re-transmissions in accordance with aspects of the present disclosure.

FIG. 4 illustrates an example of an encoding process 400 that supports equivalent puncture sets for polar coded re-transmissions in accordance with aspects of the present disclosure. The encoding process 400 may be performed by a wireless device, such as a base station 105 or UE 115 as described with reference to FIGS. 1 and 2 or a device 300 as described with reference to FIG. 3. As illustrated, an encoding device may use an (8, 3) polar code to encode three information bits 410 into a set of eight coded bits 425. However, rather than transmit all eight coded bits 425, the encoding device may transmit a subset of the coded bits, where the bits for transmission 450 may have a practical code length of five. The encoding device may implement a punctured index manipulation procedure 455 to determine equivalent puncturing patterns 435 for selecting the bits for transmission 450 from the coded bits 425. However, it is to be understood that other similar techniques may be implemented by the encoding device to determine equivalent puncturing patterns 435. Additionally, although described in the context of an (8, 3) polar code and a resource size of 5, the operations described herein may apply to any combination of values for K, N, and M, as well as any initial puncturing pattern 435-a.

The encoding device (e.g., a base station 105 or UE 115) may identify a set of un-encoded bits 405 for transmission. The un-encoded bits 405 include both active bits corresponding to the information bits 410 and nonactive-bits corresponding to the frozen bits 415. The encoding device may encode this set of unencoded bits 405 (e.g., using a polar code) to obtain a set of coded bits 425. This set of coded bits 425 may be referred to as the mother code. In some cases, the encoding device may use a generator matrix, $G_N$ 420, to encode the bits. This generator matrix, $G_N$ 420, may be an example of a square matrix, where the dimensions of the square matrix are equal to the size of the polar code, N (and, correspondingly, the size of the set of un-encoded bits 405). Based on the number of un-encoded bits 405 and the dimensions of the generator matrix, $G_N$ 420, the encoding device may cross-multiply the un-encoded bits 405 with the generator matrix to determine the coded bits 425. For example, for an array of un-encoded bits, u, the encoding device may determine an array of coded bits, x, based on the following equation:

$$[u_0 u_1 u_2 u_3 u_4 u_5 u_6 u_7] \times \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} = [x_0 x_1 x_2 x_3 x_4 x_5 x_6 x_7] \quad (1)$$

The coded bits 425 (e.g., the x array in Equation 1) may include eight bit indices, from 0 to 7 in a decimal representation or from {000} to {111} in a binary representation. These binary bit indices 430 are included in FIG. 4 to help illustrate the puncturing processes 440. In general, the decimal bit indices for the coded bits 425 may span from 0 to N−1 and the corresponding binary bit indices 430 for the coded bits 425 may span from {0 . . . 0} to {1 . . . 1}, where the number of binary digits is equal to $\log_2 N$.

To obtain a subset of the coded bits 425 for transmission (e.g., according to the resource size, M, for transmission), the encoding device may determine a first puncturing pattern 435-a. This first puncturing pattern 435-a may be determined based on the number of information bits 410, the number of coded bits 425, the number of bits for transmission 450, or some combination of these values. For example, the encoding device may determine the first puncturing pattern 435-a based on an equation or lookup table and input values containing any combination of K, N, and M. In one specific example, the first puncturing pattern 435-a may include the puncturing index set [0, 2, 5]. As illustrated, this first puncturing pattern 435-a may correspond to the set of binary representations [000, 010, 101]. The encoding device may puncture the coded bits 425 using this first puncturing pattern 435-a in a first puncturing process 440-a. The encoding device may remove the bits at bit indices 0, 2, and 5 (e.g., corresponding to the binary bit indices {000}, {010}, and {101}) from the first set of punctured coded bits 445-a to determine the first set of bits for transmission 450-a. This first set of bits for transmission 450-a may be a first subset of the set of coded bits 425. The encoding device may transmit the first set of bits for transmission 450-a to a decoding device (e.g., a UE 115 or base station 105). In this way, a portion of the x coded bits 425 are sent over the channel, while the rest of the x coded bits 425 are not transmitted in this first transmission (although the transmitting device may continue to store the coded bits 425 as the mother code in memory). The decoding device receiving the codeword may determine the first puncturing pattern 435-a (e.g., in a process similar to the one performed by the encoding device) used to puncture the coded bits 425 and may set the input LLRs to a value corresponding to an unknown LLR (e.g., zero) for the bits that are not transmitted (i.e., the punctured bits). Accordingly, the decoding device may determine input LLRs for the coded bits with binary bit indices {001}, {011}, {100}, {110} and {111} based on the received signal, and may set the input LLRs for the coded bits with binary bit indices {000}, {010}, and {101} to zeros based on the puncturing pattern 435-a.

In some cases, the encoding device may re-transmit information associated with the coded bits 425. For example, the decoding device may fail to successfully decode the information bits 410 based on the input LLRs received for the first transmission. In these cases, the encoding device may determine a second puncturing pattern 435-b, where the second puncturing pattern 435-b is derived based on the first puncturing pattern 435-a. For example, the second puncturing pattern 435-b may be the result of a manipulation procedure 455 performed on the first puncturing pattern 435-a. In some implementations, the encoding device may perform the manipulation procedure 455 to determine the second puncturing pattern 435-b. In other implementations, the manipulation procedure 455 may be performed to generate a set of pre-determined puncturing patterns 435, and the encoding device may store these pre-determined puncturing patterns 435 in memory. As illustrated, the manipulation procedure 455 may flip the binary state for the first binary bit index across the entire set of binary representations for the first puncturing pattern 435-a. Accordingly, the set of binary representations [000, 010, 101] may transform into the set of binary representations [100, 110, 001] for the second puncturing pattern 435-b. This set of binary representations [100, 110, 001] may convert to the puncturing index set [4, 6, 1] for the second puncturing pattern 435-b. The first puncturing pattern 435-a and the second puncturing pattern 435-b may be examples of equivalent puncturing patterns based on the punctured index manipulation procedure 455. That is, a decoding device attempting to decode a set of bits obtained using the first puncturing pattern 435-a will achieve a same decoding performance as when the decoding device attempts to decode a set of bits obtained using the second puncturing pattern 435-b. Other equivalent puncturing patterns 435 may be derived from the first puncturing pattern 435-a based on flipping the binary state for a different binary bit index or flipping binary bit states for a set of binary bit indices. Other equivalent puncturing patterns 435 may be derived using logical operators on one or more binary bit indices to obtain one or more other binary bit index values. For example, an equivalent puncturing pattern may be obtained by performing a manipulation procedure on a pattern for the non-punctured bits.

The encoding device may puncture the coded bits 425 using the second puncturing pattern 435-b in a second puncturing process 440-b. The encoding device may remove the bits at bit indices 1, 4, and 6 (e.g., corresponding to the binary bit indices {001}, {100}, and {110}) from the second set of punctured coded bits 445-b to determine the second set of bits for transmission 450-b. This second set of bits for transmission 450-b may be a second subset of the set of coded bits 425. The encoding device may transmit the second set of bits for transmission 450-b to a decoding device (e.g., a UE 115 or base station 105).

The decoding device receiving the codeword may determine the second puncturing pattern 435-b (e.g., in a process similar to the one performed by the encoding device) used to puncture the coded bits 425 and may set the input LLRs to zeros for the bits that are not transmitted (i.e., the punctured bits). The decoding device may combine the input LLRs determined for the first set of bits for transmission 450-a with the input LLRs determined for the second set of bits for transmission 450-b. Combining the LLRs may involve an additive LLR process, resulting in both chase combining and IR gains for the decoding process. For example, the decoding device may determine an input LLR for each bit of the set of coded bits 425 based on the two transmissions, where the decoding device determines single input LLRs for bit indices 0, 1, 2, 4, 5, and 6 based on one transmission or the other and combined input LLRs for bit indices 3 and 7 based on both transmissions. In some cases, based on combining the two transmissions, the decoding device may successfully decode the transmissions and determine the information bits 410.

Figure 5:
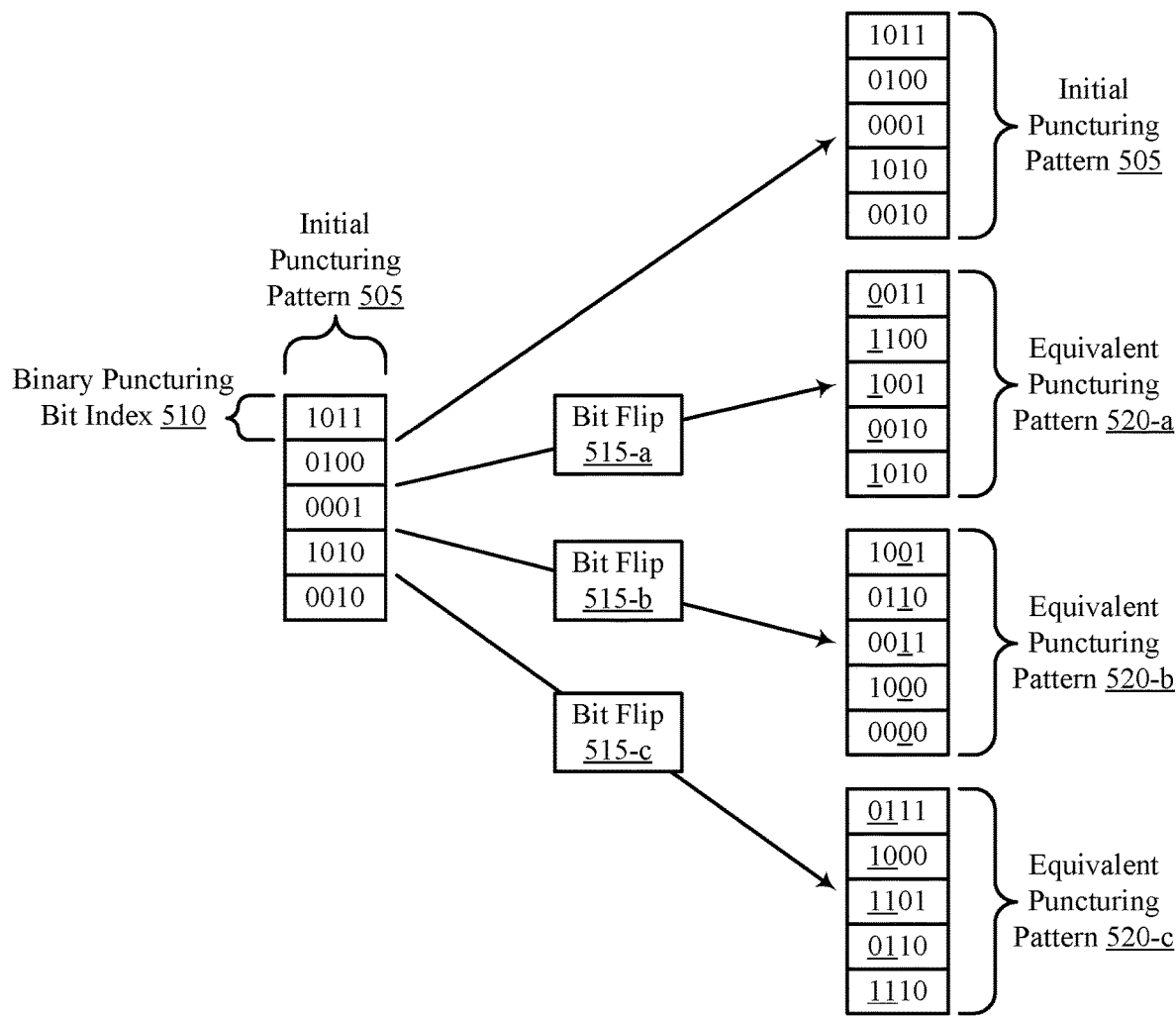
FIG. 5 illustrates an example of a punctured index manipulation procedure that supports equivalent puncture sets for polar coded re-transmissions in accordance with aspects of the present disclosure.

FIG. 5 illustrates an example of a punctured index manipulation procedure 500 that supports equivalent puncture sets for polar coded re-transmissions in accordance with aspects of the present disclosure. The punctured index manipulation procedure 500 may be performed by a wireless device, such as a base station 105 or UE 115 as described with reference to FIGS. 1 and 2 or a device 300 as described with reference to FIG. 3. The punctured index manipulation procedure 500 may be an aspect of the encoding process 400. For example, during an encoding process, an encoding device may perform a punctured index manipulation procedure 500 on an initial puncturing pattern 505 to determine one or more equivalent puncturing patterns 520 (e.g., where "equivalent" refers to the decoding performance for sets of bits obtained using the puncturing patterns). Alternatively, the punctured index manipulation procedure 500 may be performed initially to determine equivalent puncturing patterns 520, and indications of the initial puncturing pattern 505 and the equivalent puncturing patterns 520 may be stored at encoding and decoding devices for use in encoding and decoding procedures.

Generally, an initial puncturing pattern 505 may contain or be an example of a puncturing index set, $[p_0, p_1, p_2, \ldots, p_{N-M-1}]$, where N corresponds to the number of bits in the set of coded bits (e.g., the mother code length) and M corresponds to the number of bits in a subset of the set of coded bits for transmission (e.g., the resource size). Each value, $p_j$, may correspond to a bit index to puncture (e.g., any bit within the set of coded bits). These puncturing indices may be represented in binary notation, $[b_0, b_1, \ldots, b_{n-1}]$, to denote the $j^{th}$ puncture index $p_j$, where each binary bit $b_x$ has a bit value of either 0 or 1 and $n=\log_2 N$. Performing a bit flip 515 may involve flipping the binary state for the $k^{th}$ bit of all puncturing indices $p_j$ in the puncturing index set to obtain an equivalent puncturing index set, $[q_0, q_1, q_2, \ldots, q_{N-M-1}]$, where k may correspond to any value from 0 to n−1, or may correspond to a set of values from 0 to n−1. The resulting puncturing index sets $[p_0, p_1, p_2, \ldots, p_{N-M-1}]$ and $[q_0, q_1, q_2, \ldots, q_{N-M-1}]$ may be examples of equivalent puncturing patterns resulting in equivalent decoding performances.

In the specific example illustrated in FIG. 5, the initial puncturing pattern 505 may contain the puncturing index set [11, 4, 1, 10, 2] for puncturing a set of coded bits of length 16. The set of binary representations for this initial puncturing pattern 505 is [{1011}, {0100}, {0001}, {1010}, {0010}], where each binary representation is an example of a binary puncturing bit index 510. A device may perform a bit flip 515-a on the set of binary representations for this initial puncturing pattern 505 to determine a first equivalent puncturing pattern 520-a. For example, the bit flip 515-a may flip the binary state for the first binary bit, $b_0$, of each of the binary puncturing bit indices 510. This bit flip 515-a may result in a set of binary representations, [{0011}, {1100}, {1001}, {0010}, {1010}], for the equivalent puncturing pattern 520-a. In decimal form, this first equivalent puncturing pattern 520-a may contain the puncturing index set [3, 12, 9, 2, 10]. An encoding device may use the initial puncturing pattern 505 to puncture bits for an initial transmission and may use the equivalent puncturing pattern 520-*a* to puncture bits for a first re-transmission.

In some cases, an encoding device may transmit multiple re-transmissions (e.g., for further chase combining or IR gains at a decoder). Multiple equivalent puncturing patterns 520 may be obtained by flipping multiple bits (e.g., different bits or sets of bits). For example, the device may perform a bit flip 515-*b* on the set of binary representations for the initial puncturing pattern 505 to determine a second equivalent puncturing pattern 520-*b*. For example, the bit flip 515-*b* may flip the binary state for the third binary bit, $b_2$, of each of the binary puncturing bit indices 510. This bit flip 515-*b* may result in a set of binary representations, [{1001}, {0110}, {0011}, {1000}, {0000}], for the equivalent puncturing pattern 520-*b*. Additionally or alternatively, the device may perform a bit flip 515-*c* on the set of binary representations for the initial puncturing pattern 505 to determine a third equivalent puncturing pattern 520-*c*. This bit flip 515-*c* may flip the binary states for the first and second binary bits, $b_0$ and $b_1$, of each of the binary puncturing bit indices 510. This bit flip 515-*c* may result in a set of binary representations, [{0111}, {1000}, {1101}, {0110}, {1110}], for the equivalent puncturing pattern 520-*c*. In these cases, the encoding device may transmit an initial transmission and three re-transmissions by puncturing a same set of coded bits using the initial puncturing pattern 505, the first equivalent puncturing pattern 520-*a*, the second equivalent puncturing pattern 520-*b*, and the third equivalent puncturing pattern 520-*c*. All four transmissions may have equivalent decoding performances (e.g., with equal BLERs or with BLERs that are within a certain BLER difference threshold amount).

Figure 6:
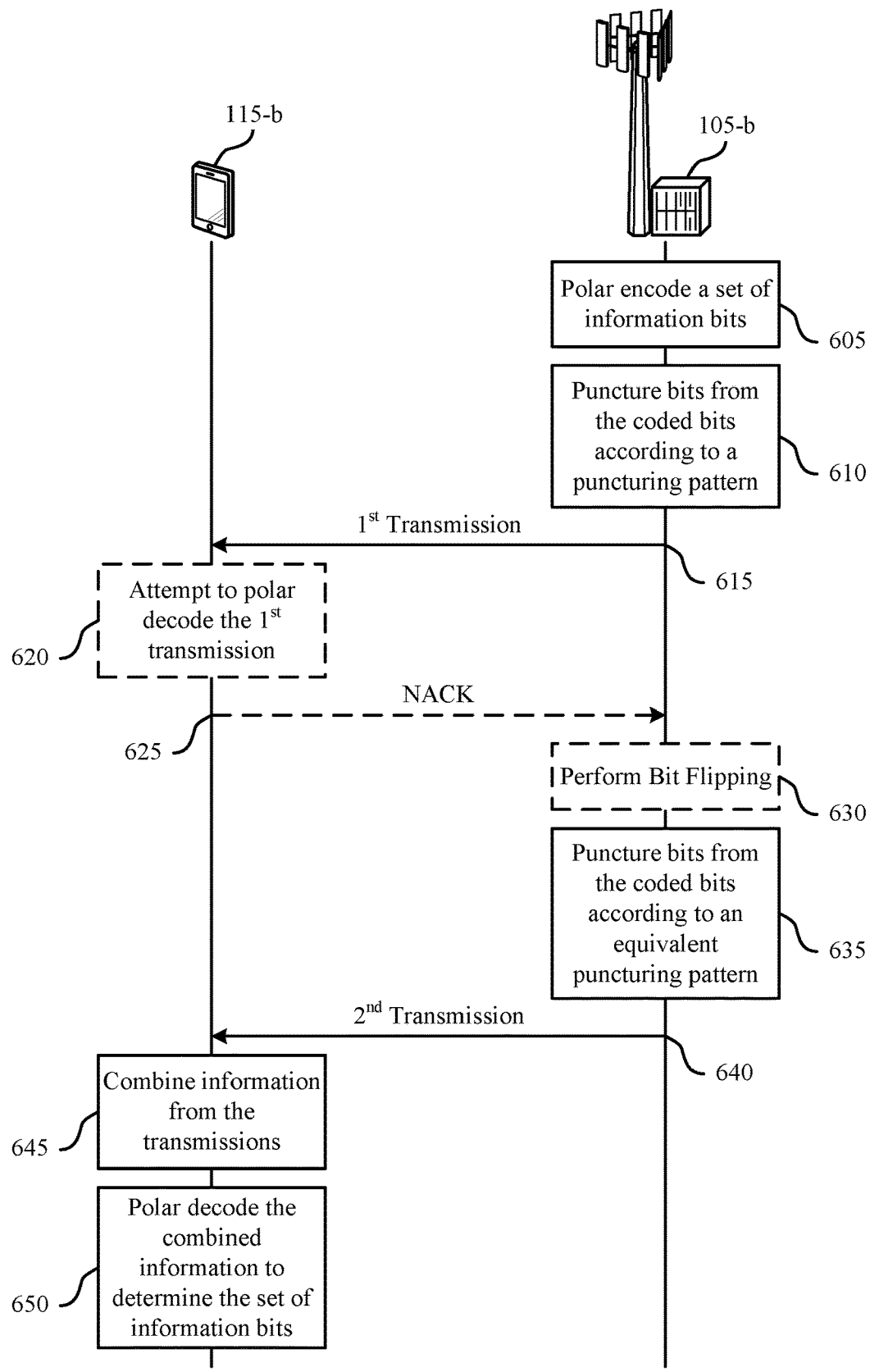
FIG. 6 illustrates an example of a process flow that supports equivalent puncture sets for polar coded re-transmissions in accordance with aspects of the present disclosure.

FIG. 6 illustrates an example of a process flow 600 that supports equivalent puncture sets for polar coded re-transmissions in accordance with aspects of the present disclosure. The process flow 600 may include a base station 105-*b* and a UE 115-*b*, which may be examples of the corresponding devices described with reference to FIGS. 1 and 2. Additionally, base station 105-*b* and UE 115-*b* may be examples of devices 300 as described with reference to FIG. 3. Although illustrated with base station 105-*b* performing the encoding operations and UE 115-*b* performing the decoding operations, it is to be understood that UE 115-*b* may alternatively perform the encoding operations and base station 105-*b* may perform the decoding operations. Furthermore, other types of wireless devices or combinations of wireless devices may perform the operations described herein. For example, the operations may be performed between base stations 105 in a backhaul network or between UEs 115 during D2D communications. Alternative examples of the following may be implemented, where some steps are performed in a different order than described or are not performed at all. In some cases, steps may include additional features not mentioned below, or further steps may be added.

At 605, base station 105-*b* may perform an encoding process according to a polar code on a set of information bits. The polar encoding process may result in a set of coded bits (i.e., a set of mother code bits of size N).

At 610, base station 105-*b* may puncture bits from the set of coded bits according to a first puncturing pattern to obtain a first subset of the set of coded bits. This subset of the set of coded bits may be a first set of bits for transmission of size M (e.g., the resource size). The first puncturing pattern may contain or be an example of a puncturing index set of length N−M. In some cases, base station 105-*b* may determine this first puncturing pattern based on a size of the set of information bits, K, a size of the set of coded bits, N, a size of the subset of the set of coded bits, M, or some combination of these.

At 615, base station 105-*b* may transmit the first subset of the set of coded bits in a first transmission. UE 115-*b* may receive, in the first transmission, first information corresponding to the first subset of the set of coded bits. For example, this first information may be a first set of LLRs.

At 620, UE 115-*b* may attempt to decode the first transmission. In some cases, the decoding process may be unsuccessful (e.g., UE 115-*b* may not successfully determine the set of information bits based on the first transmission). In these cases, at 625, UE 115-*b* may transmit a NACK message in response to the first transmission as part of a HARQ process. Transmitting the NACK message may be based on the unsuccessful decoding process at 620. In some examples, base station 105-*b* may determine to send a second transmission for the set of coded bits based on receiving the NACK message at 625. In some other examples, base station 105-*b* may determine to send the second transmission based on a pre-configuration of base station 105-*b* or based on a received configuration message.

At 630, base station 105-*b* may determine a second puncturing pattern based on the first puncturing pattern. The first puncturing pattern and the second puncturing pattern may be examples of equivalent puncturing patterns. For example, a subset of the set of coded bits determined using the second puncturing pattern may have an equivalent decoding performance as the first subset of the set of coded bits determined using the first puncturing pattern.

Determining the second puncturing pattern may involve base station 105-*b* performing a punctured index manipulation procedure. For example, base station 105-*b* may identify a first set of binary representations for the first puncturing pattern, where each binary representation of this first set of binary representations contains a set of binary bits corresponding to a puncture index. Base station 105-*b* may flip a binary state for a bit of each binary representation to obtain a second set of binary representations, where the bit corresponds to same binary bit index across the entire set of binary representations. Flipping the binary state may involve switching a bit value of 0 to a bit value of 1 or switching a bit value of 1 to a bit value of 0. Base station 105-*b* may then convert the resulting second set of binary representations into the second puncturing pattern.

At 635, base station 105-*b* may puncture bits from the set of coded bits according to the second puncturing pattern to obtain a second subset of the set of coded bits. At 640, base station 105-*b* may transmit this second subset of the set of coded bits in a second transmission (e.g., a re-transmission of the first transmission). UE 115-*b* may receive, in the second transmission, second information corresponding to the second subset of the set of coded bits.

At 645, UE 115-*b* may combine the first information from the first transmission with the second information from the second transmission to obtain combined information for the set of coded bits. In some cases, combining the information may involve combining (e.g., adding) LLRs for the two transmissions. At 650, UE 115-*b* may perform a decoding process on the combined information according to the polar code. In some cases, UE 115-*b* may determine the set of information bits based on decoding the combined information (e.g., as opposed to decoding just the first information or the second information).

Figure 7:
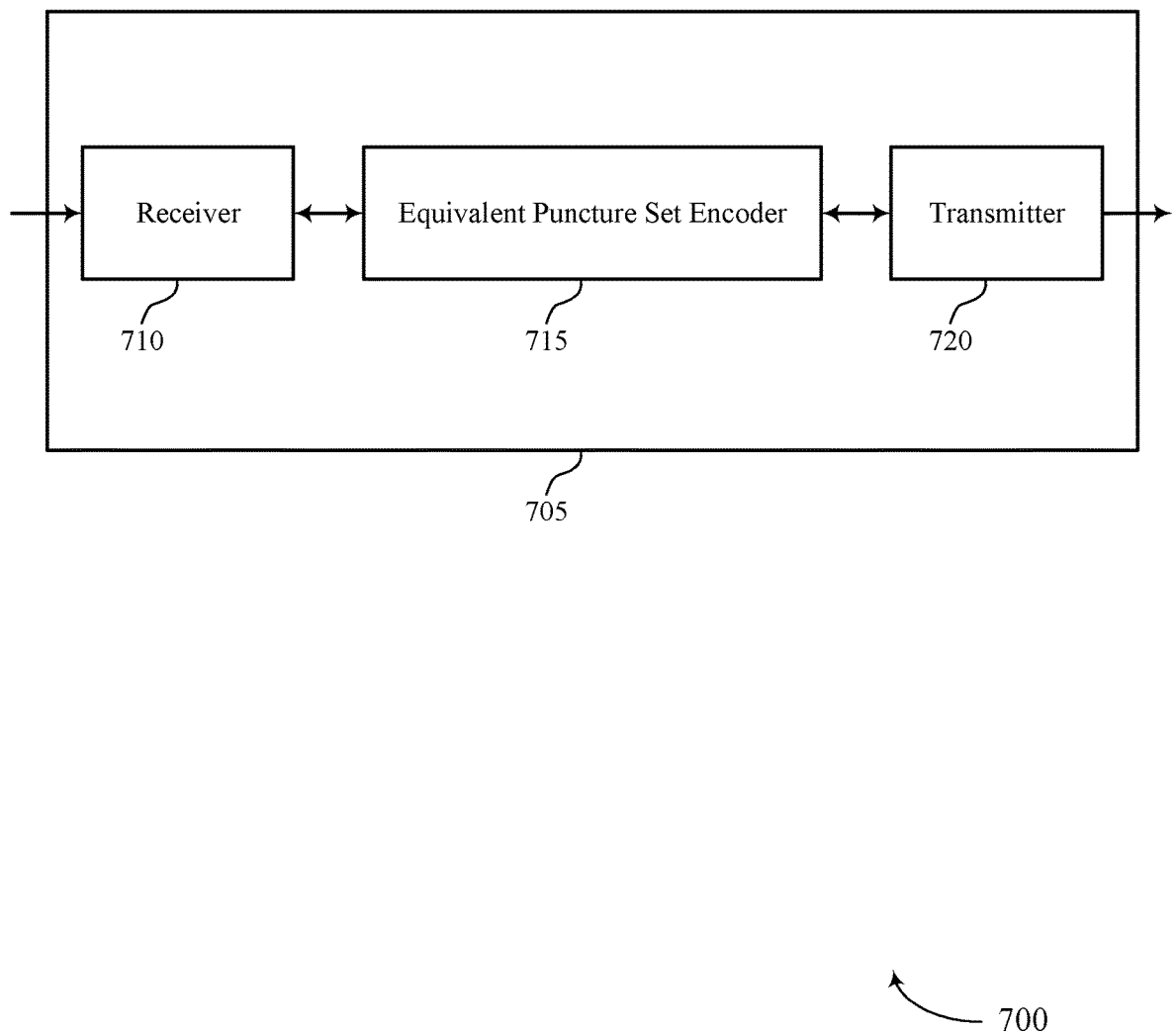
FIGS. 7 and 8 show block diagrams of devices that support equivalent puncture sets for polar coded re-transmissions in accordance with aspects of the present disclosure.

FIG. 7 shows a block diagram 700 of a device 705 that supports equivalent puncture sets for polar coded re-transmissions in accordance with aspects of the present disclosure. The device 705 may be an example of aspects of a base station 105 or a UE 115 as described herein. The device 705 may include a receiver 710, an equivalent puncture set encoder 715, and a transmitter 720. The device 705 may also include a processor. Each of these components may be in communication with one another (e.g., via one or more buses).

The receiver 710 may receive information such as packets, user data, or control information associated with various information channels (e.g., control channels, data channels, and information related to equivalent puncture sets for polar coded re-transmissions, etc.). Information may be passed on to other components of the device 705. The receiver 710 may be an example of aspects of the transceiver 1320 or 1420 described with reference to FIGS. 13 and 14. The receiver 710 may utilize a single antenna or a set of antennas.

The equivalent puncture set encoder 715 may perform an encoding process according to a polar code on a set of information bits to determine a set of coded bits, puncture bits from the set of coded bits according to a first puncturing pattern to obtain a first subset of the set of coded bits, and transmit the first subset of the set of coded bits in a first transmission. Furthermore, the equivalent puncture set encoder 715 may puncture bits from the set of coded bits according to a second puncturing pattern to obtain a second subset of the set of coded bits, where the second puncturing pattern is derived from the first puncturing pattern, and may transmit the second subset of the set of coded bits in a second transmission. The equivalent puncture set encoder 715 may be an example of aspects of the equivalent puncture set encoder 1310 or 1410 described herein.

The actions performed by the equivalent puncture set encoder 715 as described herein may be implemented to realize one or more potential advantages. For example, a base station 105 or UE 115 using an equivalent puncturing pattern for re-transmission of a polar coded transmission may support IR gains at a decoding device. The IR gains may result in improved decoding reliability at the decoding device. Additionally, the equivalent puncturing patterns for re-transmissions may support similar decoding performances at the decoding device, supporting efficient polar decoding. The equivalent puncturing patterns may also support robust performance in channels with varying SNR measurements. As such, the base station 105 or UE 115 performing the polar encoding and transmission may reduce a number of re-transmissions used to successfully send information to the decoding device.

Based on puncturing bits from a set of coded bits according to a second puncturing pattern for re-transmission, where the second puncturing pattern is derived from a first puncturing pattern (e.g., the second puncturing pattern is "equivalent" to the first puncturing pattern used for the first transmission), a processor of the base station 105 or UE 115 (e.g., a processor controlling the receiver 710, the equivalent puncture set encoder 715, the transmitter 720, etc.) may reduce processing resources used for transmission. For example, the bit puncturing procedure for re-transmissions described herein may improve decoding reliability at a receiving device (e.g., a UE 115 or base station 105). As such, the transmitting device may reduce the number of re-transmission processes performed to successfully send information to the receiving device (e.g., over a downlink channel, an uplink channel, a sidelink channel, a wireless backhaul channel, etc.). Reducing the number of re-transmission processes may reduce a number of times the processor ramps up processing power and turns on processing units to handle message encoding and transmission. Furthermore, reducing the number of re-transmission processes performed by the device may reduce the signaling overhead on the channel.

The equivalent puncture set encoder 715, or its sub-components, may be implemented in hardware, code (e.g., software or firmware) executed by a processor, or any combination thereof. If implemented in code executed by a processor, the functions of the equivalent puncture set encoder 715, or its sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The equivalent puncture set encoder 715, or its sub-components, may be physically located at various positions, including being distributed such that portions of functions are implemented at different physical locations by one or more physical components. In some examples, the equivalent puncture set encoder 715, or its sub-components, may be a separate and distinct component in accordance with various aspects of the present disclosure. In some examples, the equivalent puncture set encoder 715, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 720 may transmit signals generated by other components of the device 705. In some examples, the transmitter 720 may be collocated with a receiver 710 in a transceiver module. For example, the transmitter 720 may be an example of aspects of the transceiver 1320 or 1420 described with reference to FIGS. 13 and 14. The transmitter 720 may utilize a single antenna or a set of antennas.

Figure 8:
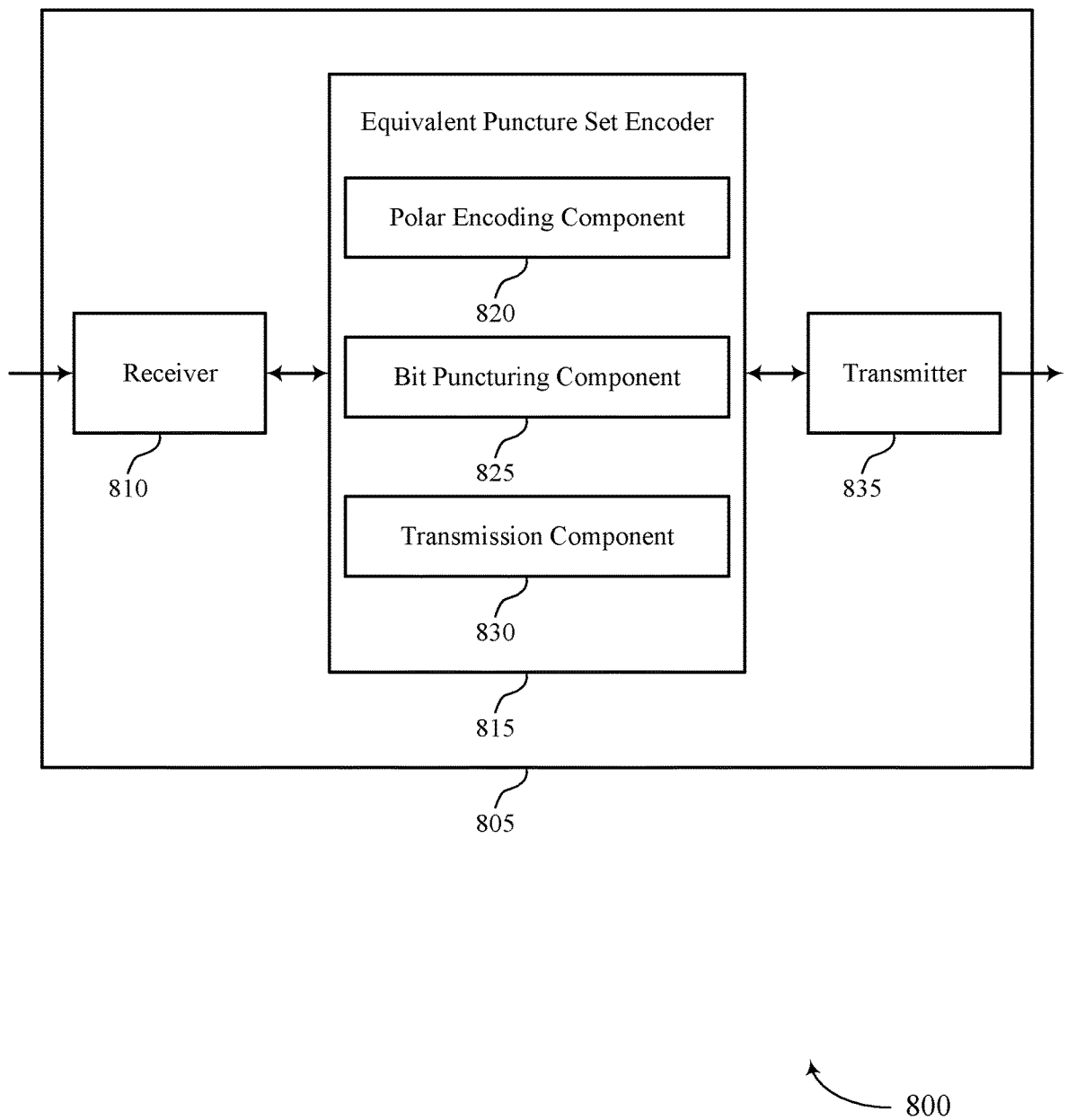

FIG. 8 shows a block diagram 800 of a device 805 that supports equivalent puncture sets for polar coded re-transmissions in accordance with aspects of the present disclosure. The device 805 may be an example of aspects of a device 705, a base station 105, or a UE 115 as described herein. The device 805 may include a receiver 810, an equivalent puncture set encoder 815, and a transmitter 835. The device 805 may also include a processor. Each of these components may be in communication with one another (e.g., via one or more buses).

The receiver 810 may receive information such as packets, user data, or control information associated with various information channels (e.g., control channels, data channels, and information related to equivalent puncture sets for polar coded re-transmissions, etc.). Information may be passed on to other components of the device 805. The receiver 810 may be an example of aspects of the transceiver 1320 or 1420 described with reference to FIGS. 13 and 14. The receiver 810 may utilize a single antenna or a set of antennas.

The equivalent puncture set encoder 815 may be an example of aspects of the equivalent puncture set encoder 715 as described herein. The equivalent puncture set encoder 815 may include a polar encoding component 820, a bit puncturing component 825, and a transmission component 830. The equivalent puncture set encoder 815 may be an example of aspects of the equivalent puncture set encoder 1310 or 1410 described herein.

The polar encoding component 820 may perform an encoding process according to a polar code on a set of information bits to determine a set of coded bits. The bit puncturing component 825 may puncture bits from the set of coded bits according to a first puncturing pattern to obtain a first subset of the set of coded bits. The transmission component 830 may transmit the first subset of the set of coded bits in a first transmission.

The bit puncturing component 825 may additionally puncture bits from the set of coded bits according to a second puncturing pattern to obtain a second subset of the set of coded bits, where the second puncturing pattern is derived from the first puncturing pattern. The transmission component 830 may additionally transmit the second subset of the set of coded bits in a second transmission.

The transmitter 835 may transmit signals generated by other components of the device 805. In some examples, the transmitter 835 may be collocated with a receiver 810 in a transceiver module. For example, the transmitter 835 may be an example of aspects of the transceiver 1320 or 1420 described with reference to FIGS. 13 and 14. The transmitter 835 may utilize a single antenna or a set of antennas. In some cases, the transmission component 830 may be connected to or a component of the transmitter 835.

Figure 9:
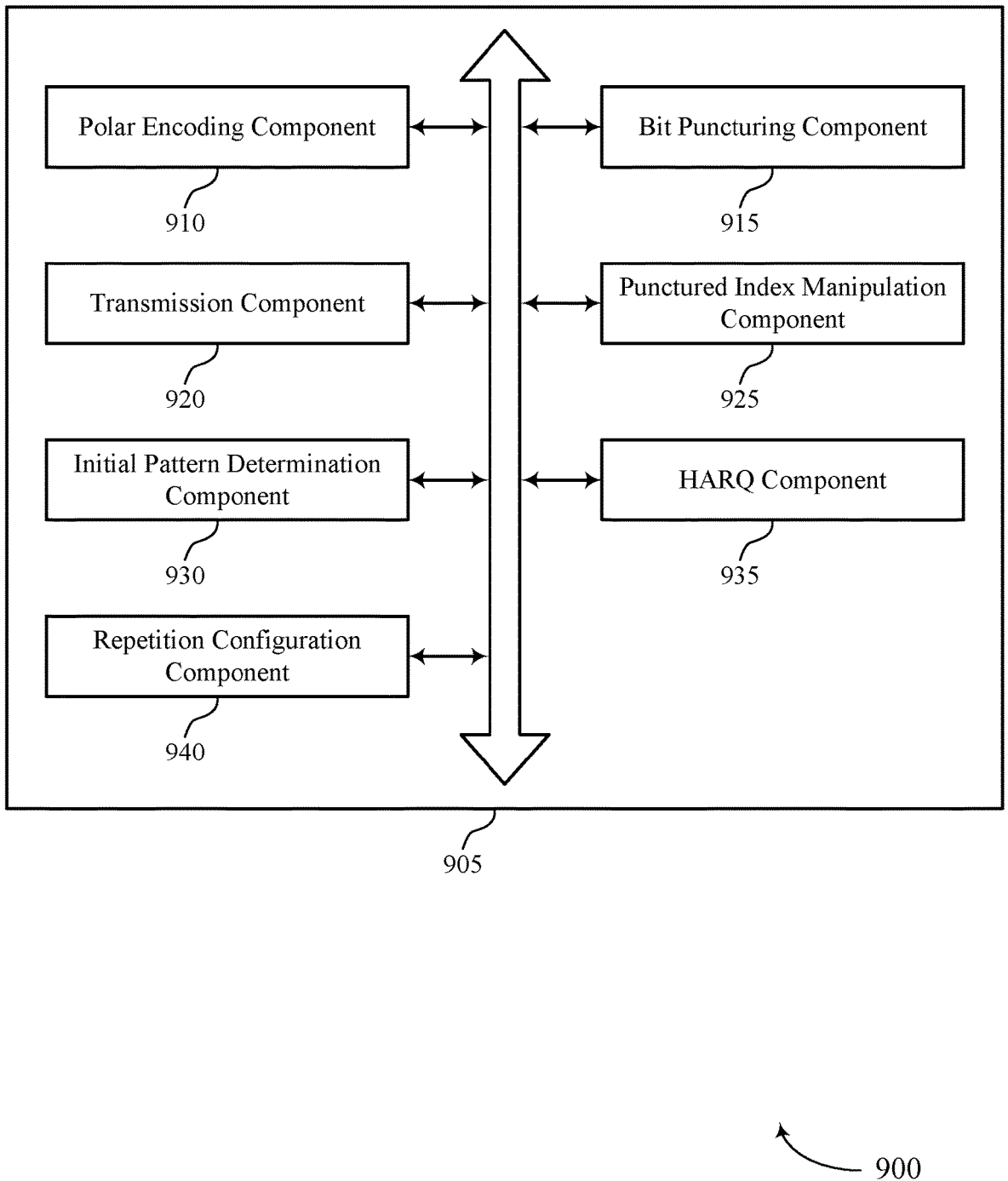
FIG. 9 shows a block diagram of an equivalent puncture set encoder that supports equivalent puncture sets for polar coded re-transmissions in accordance with aspects of the present disclosure.

FIG. 9 shows a block diagram 900 of an equivalent puncture set encoder 905 that supports equivalent puncture sets for polar coded re-transmissions in accordance with aspects of the present disclosure. The equivalent puncture set encoder 905 may be an example of aspects of an equivalent puncture set encoder 715, an equivalent puncture set encoder 815, an equivalent puncture set encoder 1310, or an equivalent puncture set encoder 1410 described herein. The equivalent puncture set encoder 905 may include a polar encoding component 910, a bit puncturing component 915, a transmission component 920, a punctured index manipulation component 925, an initial pattern determination component 930, a HARQ component 935, and a repetition configuration component 940. Each of these modules may communicate, directly or indirectly, with one another (e.g., via one or more buses).

The polar encoding component 910 may perform an encoding process according to a polar code on a set of information bits to determine a set of coded bits.

The bit puncturing component 915 may puncture bits from the set of coded bits according to a first puncturing pattern to obtain a first subset of the set of coded bits. The transmission component 920 may transmit the first subset of the set of coded bits in a first transmission.

The bit puncturing component 915 may additionally puncture bits from the set of coded bits according to a second puncturing pattern to obtain a second subset of the set of coded bits, where the second puncturing pattern is derived from the first puncturing pattern. In some cases, the second subset of the set of coded bits has an equivalent decoding performance as the first subset of the set of coded bits for the polar code. The transmission component 920 may transmit the second subset of the set of coded bits in a second transmission.

The punctured index manipulation component 925 may determine the second puncturing pattern based on the first puncturing pattern. In some cases, determining the second puncturing pattern may involve the punctured index manipulation component 925 identifying a first set of binary representations for the first puncturing pattern, where each binary representation of the first set of binary representations includes a set of binary bits corresponding to a bit index to puncture according to the first puncturing pattern. The punctured index manipulation component 925 may flip, for each binary representation of the first set of binary representations, a binary state for a bit of the set of binary bits corresponding to a first binary bit index across the first set of binary representations, where the flipping results in a second set of binary representations. The punctured index manipulation component 925 may convert the second set of binary representations into the second puncturing pattern.

In some cases, the punctured index manipulation component 925 may determine a third puncturing pattern based on the first puncturing pattern. In these examples, determining the third puncturing pattern may involve the punctured index manipulation component 925 flipping, for each binary representation of the first set of binary representations, a binary state for a different bit of the set of binary bits corresponding to a second binary bit index across the first set of binary representations, where the flipping results in a third set of binary representations. The punctured index manipulation component 925 may convert the third set of binary representations into the third puncturing pattern. In some examples, the bit puncturing component 915 may puncture bits from the set of coded bits according to the third puncturing pattern to obtain a third subset of the set of coded bits, where the third subset of the set of coded bits has an equivalent decoding performance as the first subset of the set of coded bits and the second subset of the set of coded bits for the polar code. The transmission component 920 may transmit the third subset of the set of coded bits in a third transmission.

In other examples, the punctured index manipulation component 925 may determine a third puncturing pattern based on the first puncturing pattern. In these examples, determining the third puncturing pattern may involve the punctured index manipulation component 925 flipping, for each binary representation of the first set of binary representations, binary states for a set of bits of the set of binary bits corresponding to a first set of binary bit indices across the first set of binary representations, where the flipping results in a third set of binary representations. The punctured index manipulation component 925 may convert the third set of binary representations into the third puncturing pattern. In some examples, the bit puncturing component 915 may puncture bits from the set of coded bits according to the third puncturing pattern to obtain a third subset of the set of coded bits, where the third subset of the set of coded bits has an equivalent decoding performance as the first subset of the set of coded bits and the second subset of the set of coded bits for the polar code. The transmission component 920 may transmit the third subset of the set of coded bits in a third transmission The initial pattern determination component 930 may determine the first puncturing pattern based on a size of the set of information bits, a size of the set of coded bits, a size of the first subset of the set of coded bits, or a combination thereof.

The HARQ component 935 may receive a NACK message in response to the first transmission and may determine to transmit the second transmission based on the NACK message. The repetition configuration component 940 may determine to transmit the second transmission based on a pre-configuration or a received configuration message.

Figure 10:
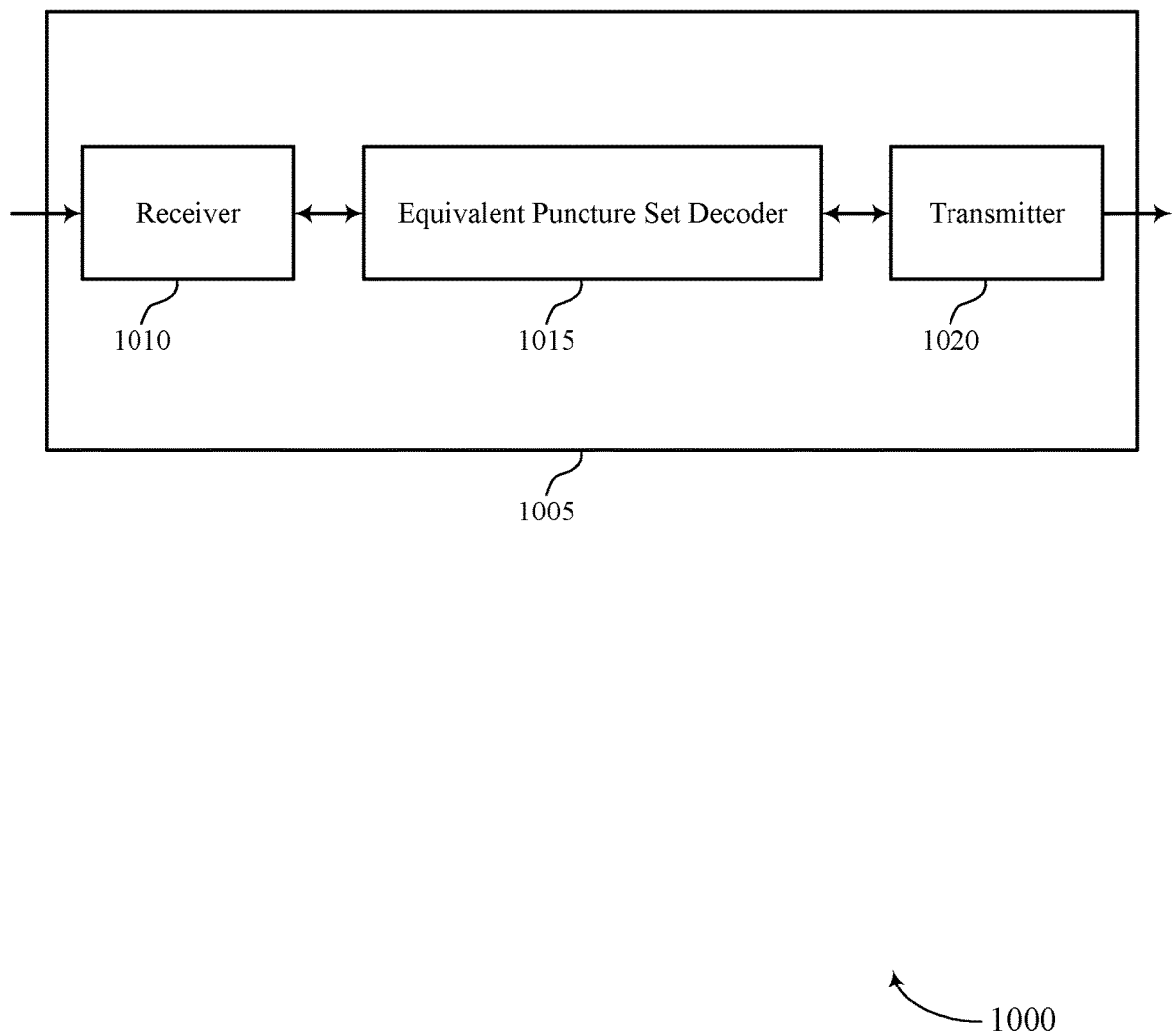
FIGS. 10 and 11 show block diagrams of devices that support equivalent puncture sets for polar coded re-transmissions in accordance with aspects of the present disclosure.

FIG. 10 shows a block diagram 1000 of a device 1005 that supports equivalent puncture sets for polar coded re-transmissions in accordance with aspects of the present disclosure. The device 1005 may be an example of aspects of a UE 115 or base station 105 as described herein. The device 1005 may include a receiver 1010, an equivalent puncture set decoder 1015, and a transmitter 1020. The device 1005 may also include a processor. Each of these components may be in communication with one another (e.g., via one or more buses).

The receiver 1010 may receive information such as packets, user data, or control information associated with various information channels (e.g., control channels, data channels, and information related to equivalent puncture sets for polar coded re-transmissions, etc.). Information may be passed on to other components of the device 1005. The receiver 1010 may be an example of aspects of the transceiver 1320 or 1420 described with reference to FIGS. 13 and 14. The receiver 1010 may utilize a single antenna or a set of antennas.

The equivalent puncture set decoder 1015 may receive, in a first transmission associated with a set of information bits, first information corresponding to a first subset of a set of coded bits, where the first subset of the set of coded bits is based on the set of coded bits and a first puncturing pattern, and may receive, in a second transmission associated with the set of information bits, second information corresponding to a second subset of the set of coded bits, where the second subset of the set of coded bits is based on the set of coded bits and a second puncturing pattern, and where the second puncturing pattern is derived from the first puncturing pattern. The equivalent puncture set decoder 1015 may combine the first information and the second information to obtain combined information for the set of coded bits and may perform a decoding process according to a polar code on the combined information. The equivalent puncture set decoder 1015 may be an example of aspects of the equivalent puncture set decoder 1310 or 1410 described herein.

The actions performed by the equivalent puncture set decoder 1015 as described herein may be implemented to realize one or more potential advantages. For example, combining information from a first transmission and a re-transmission using equivalent puncturing patterns when performing a polar decoding process may allow a UE 115 or base station 105 to achieve IR gains. Specifically, using different puncturing patterns for the same set of mother code bits may support the UE 115 or base station 105 receiving supplemental mother code bits and receiving multiple input LLRs corresponding to a same mother code bit. The IR gains (e.g., along with chase combining gains) may result in improved decoding reliability at the UE 115 or base station 105. Additionally, the equivalent puncturing patterns for re-transmissions may support similar decoding performances at the decoding device, supporting efficient polar decoding. The equivalent puncturing patterns may also support robust decoding performance in channels with varying SNR measurements.

Based on combining the information from re-transmissions using equivalent puncturing patterns to obtain combined information for a set of coded bits and performing a decoding process according to a polar code on the combined information, a processor of the UE 115 or base station 105 (e.g., a processor controlling the receiver 1010, the equivalent puncture set decoder 1015, the transmitter 1020, etc.) may reduce processing resources used for reception. For example, the bit puncturing procedure for re-transmissions described herein may improve decoding reliability at the UE 115 or base station 105. As such, the UE 115 or base station 105 may reduce the number of reception and decoding processes performed to successfully receive information from a transmitting device (e.g., by reducing the number of re-transmissions). Reducing the number of reception and decoding processes may reduce a number of times the processor ramps up processing power and turns on processing units to handle message reception and decoding. Furthermore, reducing the number of re-transmission processes performed by the transmitting device may reduce the signaling overhead on the channel. In addition, the transmitting device may reduce the amount of resources used for transmissions (e.g., using a lower aggregation level) based on increased reliability of reception by the receiving device (e.g., the UE 115 or base station 105), in some cases.

The equivalent puncture set decoder 1015, or its sub-components, may be implemented in hardware, code (e.g., software or firmware) executed by a processor, or any combination thereof. If implemented in code executed by a processor, the functions of the equivalent puncture set decoder 1015, or its sub-components may be executed by a general-purpose processor, a DSP, an ASIC, an FPGA or other programmable logic device, discrete gate or transistor logic, discrete hardware components, or any combination thereof designed to perform the functions described in the present disclosure.

The equivalent puncture set decoder 1015, or its sub-components, may be physically located at various positions, including being distributed such that portions of functions are implemented at different physical locations by one or more physical components. In some examples, the equivalent puncture set decoder 1015, or its sub-components, may be a separate and distinct component in accordance with various aspects of the present disclosure. In some examples, the equivalent puncture set decoder 1015, or its sub-components, may be combined with one or more other hardware components, including but not limited to an I/O component, a transceiver, a network server, another computing device, one or more other components described in the present disclosure, or a combination thereof in accordance with various aspects of the present disclosure.

The transmitter 1020 may transmit signals generated by other components of the device 1005. In some examples, the transmitter 1020 may be collocated with a receiver 1010 in a transceiver module. For example, the transmitter 1020 may be an example of aspects of the transceiver 1320 or 1420 described with reference to FIGS. 13 and 14. The transmitter 1020 may utilize a single antenna or a set of antennas.

Figure 11:
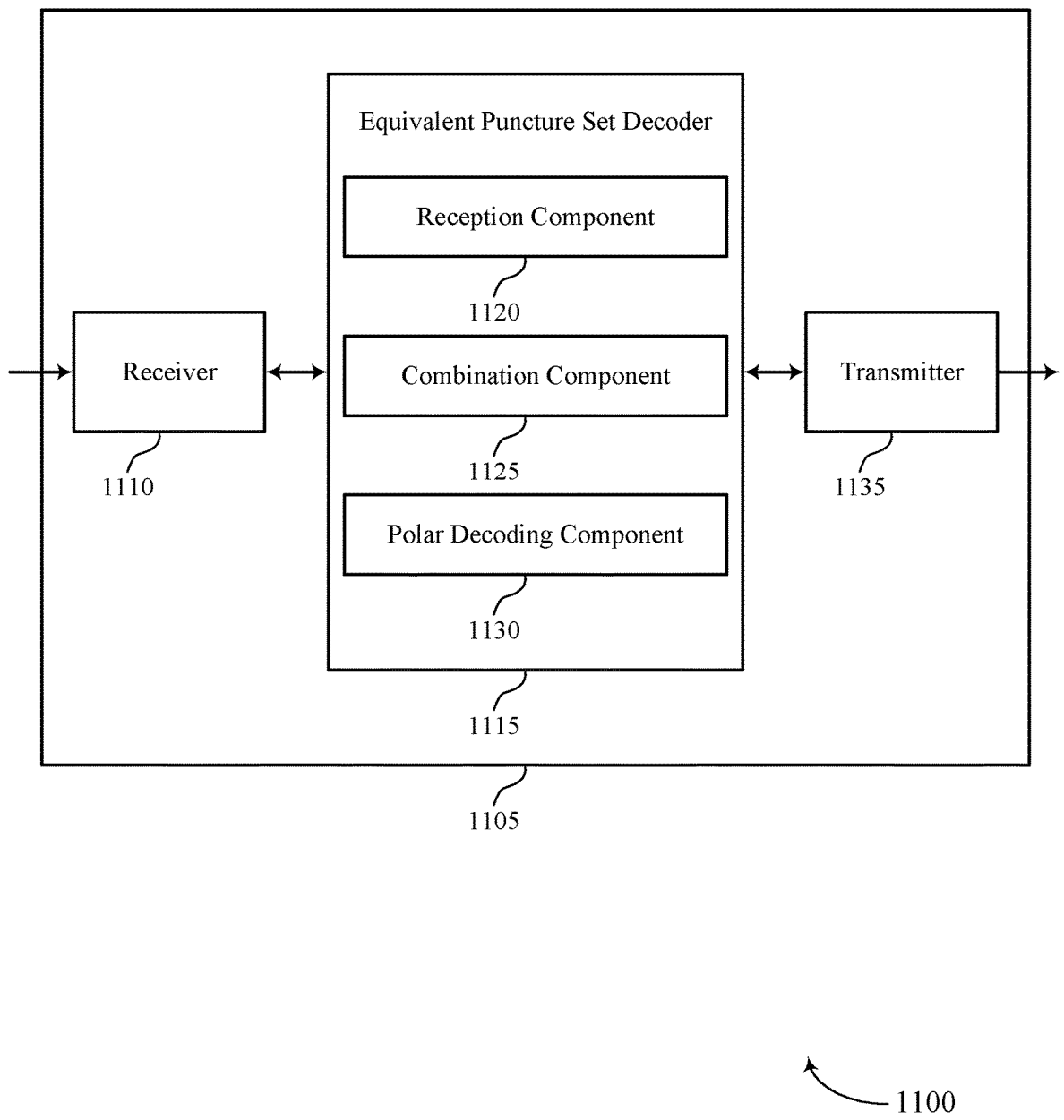

FIG. 11 shows a block diagram 1100 of a device 1105 that supports equivalent puncture sets for polar coded re-transmissions in accordance with aspects of the present disclosure. The device 1105 may be an example of aspects of a device 1005, a UE 115, or a base station 105 as described herein. The device 1105 may include a receiver 1110, an equivalent puncture set decoder 1115, and a transmitter 1135. The device 1105 may also include a processor. Each of these components may be in communication with one another (e.g., via one or more buses).

The receiver 1110 may receive information such as packets, user data, or control information associated with various information channels (e.g., control channels, data channels, and information related to equivalent puncture sets for polar coded re-transmissions, etc.). Information may be passed on to other components of the device 1105. The receiver 1110 may be an example of aspects of the transceiver 1320 or 1420 described with reference to FIGS. 13 and 14. The receiver 1110 may utilize a single antenna or a set of antennas. In some cases, a reception component 1120 may be connected to or a component of the receiver 1110.

The equivalent puncture set decoder 1115 may be an example of aspects of the equivalent puncture set decoder 1015 as described herein. The equivalent puncture set decoder 1115 may include a reception component 1120, a combination component 1125, and a polar decoding component 1130. The equivalent puncture set decoder 1115 may be an example of aspects of the equivalent puncture set decoder 1310 or 1410 described herein.

The reception component 1120 may receive, in a first transmission associated with a set of information bits, first information corresponding to a first subset of a set of coded bits, where the first subset of the set of coded bits is based on the set of coded bits and a first puncturing pattern. The reception component 1120 may additionally receive, in a second transmission associated with the set of information bits, second information corresponding to a second subset of the set of coded bits, where the second subset of the set of coded bits is based on the set of coded bits and a second puncturing pattern, and where the second puncturing pattern is derived from the first puncturing pattern.

The combination component 1125 may combine the first information and the second information to obtain combined information for the set of coded bits. The polar decoding component 1130 may perform a decoding process according to a polar code on the combined information.

The transmitter 1135 may transmit signals generated by other components of the device 1105. In some examples, the transmitter 1135 may be collocated with a receiver 1110 in a transceiver module. For example, the transmitter 1135 may be an example of aspects of the transceiver 1320 or 1420 described with reference to FIGS. 13 and 14. The transmitter 1135 may utilize a single antenna or a set of antennas.

Figure 12:
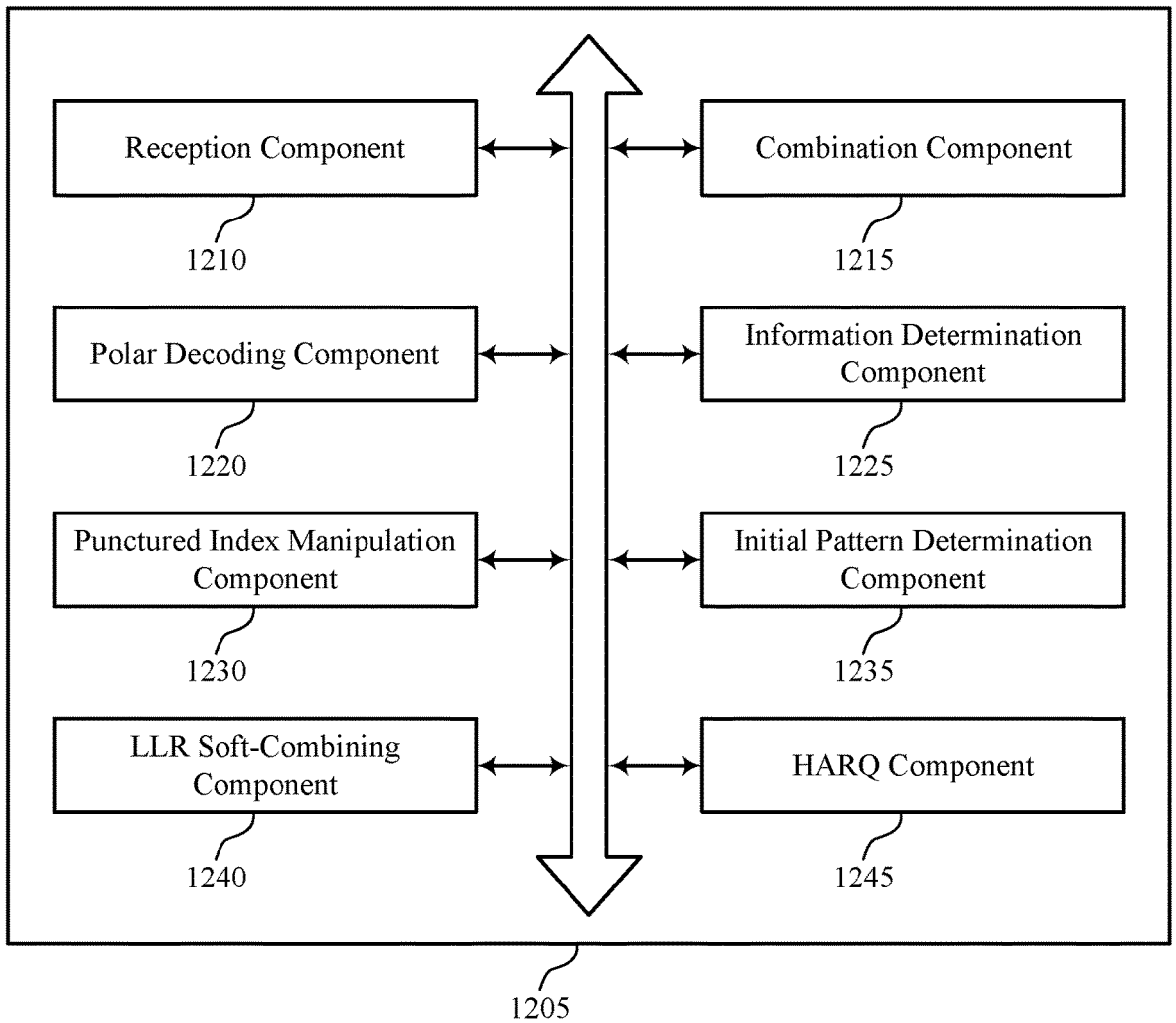
FIG. 12 shows a block diagram of an equivalent puncture set decoder that supports equivalent puncture sets for polar coded re-transmissions in accordance with aspects of the present disclosure.

FIG. 12 shows a block diagram 1200 of an equivalent puncture set decoder 1205 that supports equivalent puncture sets for polar coded re-transmissions in accordance with aspects of the present disclosure. The equivalent puncture set decoder 1205 may be an example of aspects of an equivalent puncture set decoder 1015, an equivalent puncture set decoder 1115, an equivalent puncture set decoder 1310, or an equivalent puncture set decoder 1410 described herein. The equivalent puncture set decoder 1205 may include a reception component 1210, a combination component 1215, a polar decoding component 1220, an information determination component 1225, a punctured index manipulation component 1230, an initial pattern determination component 1235, an LLR soft-combining component 1240, and a HARQ component 1245. Each of these modules may communicate, directly or indirectly, with one another (e.g., via one or more buses).

The reception component 1210 may receive, in a first transmission associated with a set of information bits, first information corresponding to a first subset of a set of coded bits, where the first subset of the set of coded bits is based on the set of coded bits and a first puncturing pattern. Additionally, the reception component 1210 may receive, in a second transmission associated with the set of information bits, second information corresponding to a second subset of the set of coded bits, where the second subset of the set of coded bits is based on the set of coded bits and a second puncturing pattern, and where the second puncturing pattern is derived from the first puncturing pattern. In some cases, the second subset of the set of coded bits has an equivalent decoding performance as the first subset of the set of coded bits for a polar code.

The combination component 1215 may combine the first information and the second information to obtain combined information for the set of coded bits. In some cases, combining the first information and the second information to obtain the combined information may involve the LLR soft-combining component 1240 soft-combining a first set of LLRs corresponding to the first information with a second set of LLRs corresponding to the second information to obtain a combined set of LLRs corresponding to the combined information. In some examples, soft-combining the information may involve the LLR soft-combining component 1240 adding LLRs from the first set of LLRs to LLRs from the second set of LLRs that correspond to same bits of the set of coded bits.

The polar decoding component 1220 may perform a decoding process according to the polar code on the combined information. The information determination component 1225 may determine the set of information bits based on the decoding process.

The punctured index manipulation component 1230 may determine the second puncturing pattern based on the first puncturing pattern. Determining the second puncturing pattern may involve the punctured index manipulation component 1230 identifying a first set of binary representations for the first puncturing pattern, where each binary representation of the first set of binary representations includes a set of binary bits corresponding to a bit index to puncture according to the first puncturing pattern. The punctured index manipulation component 1230 may flip, for each binary representation of the first set of binary representations, a binary state for a bit of the set of binary bits corresponding to a first binary bit index across the first set of binary representations, where the flipping results in a second set of binary representations. The punctured index manipulation component 1230 may convert the second set of binary representations into the second puncturing pattern.

In some cases, the punctured index manipulation component 1230 may determine a third puncturing pattern based on the first puncturing pattern, where determining the third puncturing pattern involves the punctured index manipulation component 1230 flipping, for each binary representation of the first set of binary representations, a binary state for a different bit of the set of binary bits corresponding to a second binary bit index across the first set of binary representations, where the flipping results in a third set of binary representations. The punctured index manipulation component 1230 may convert the third set of binary representations into the third puncturing pattern. In some examples, the reception component 1210 may receive, in a third transmission associated with the set of information bits, third information corresponding to a third subset of the set of coded bits, where the third subset of the set of coded bits is based on the set of coded bits and the third puncturing pattern, and where the third subset of the set of coded bits has an equivalent decoding performance as the first subset of the set of coded bits and the second subset of the set of coded bits for the polar code. The combination component 1215 may combine the first information, the second information, and the third information to obtain second combined information for the set of coded bits. The polar decoding component 1220 may perform a second decoding process according to the polar code on the second combined information.

In other cases, the punctured index manipulation component 1230 may determine a third puncturing pattern based on the first puncturing pattern, where determining the third puncturing pattern involves the punctured index manipulation component 1230 flipping, for each binary representation of the first set of binary representations, binary states for a set of bits of the set of binary bits corresponding to a set of binary bit indices across all of the first set of binary representations, where the flipping results in a third set of binary representations. The punctured index manipulation component 1230 may convert the third set of binary representations into the third puncturing pattern. In some examples, the reception component 1210 may receive, in a third transmission associated with the set of information bits, third information corresponding to a third subset of the set of coded bits, where the third subset of the set of coded bits is based on the set of coded bits and the third puncturing pattern, and where the third subset of the set of coded bits has an equivalent decoding performance as the first subset of the set of coded bits and the second subset of the set of coded bits for the polar code. The combination component 1215 may combine the first information, the second information, and the third information to obtain second combined information for the set of coded bits. The polar decoding component 1220 may perform a second decoding process according to the polar code on the second combined information.

The initial pattern determination component 1235 may determine the first puncturing pattern based on a size of the set of information bits, a size of the set of coded bits, a size of the first subset of the set of coded bits, or a combination thereof.

The HARQ component 1245 may perform an unsuccessful decoding process according to the polar code on the first information, where performing the decoding process according to the polar code on the combined information is based on the unsuccessful decoding process. The HARQ component 1245 may transmit a NACK message in response to the first transmission based on the unsuccessful decoding process, where the second transmission is received based on the NACK message.

Figure 13:
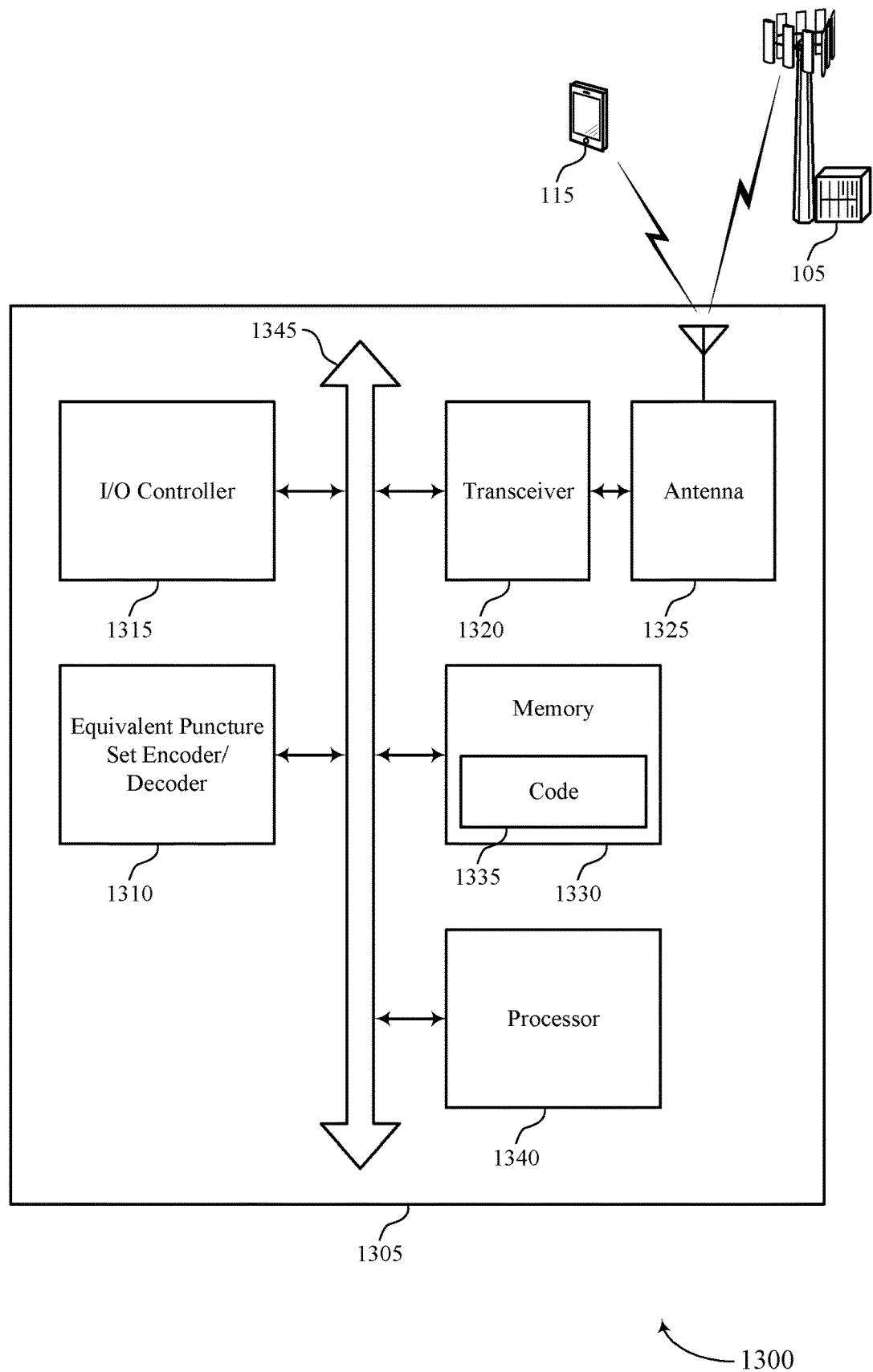
FIGS. 13 and 14 show diagrams of systems including devices that support equivalent puncture sets for polar coded re-transmissions in accordance with aspects of the present disclosure.

FIG. 13 shows a diagram of a system 1300 including a device 1305 that supports equivalent puncture sets for polar coded re-transmissions in accordance with aspects of the present disclosure. The device 1305 may be an example of or include the components of device 705, device 805, device 1005, device 1105, a base station 105, or a UE 115 as described herein. The device 1305 may include components for bi-directional voice and data communications including components for transmitting and receiving communications, including an equivalent puncture set encoder/decoder 1310, an I/O controller 1315, a transceiver 1320, an antenna 1325, memory 1330, and a processor 1340. These components may be in electronic communication via one or more buses (e.g., bus 1345).

In some cases, the equivalent puncture set encoder/decoder 1310 may perform an encoding process according to a polar code on a set of information bits to determine a set of coded bits, puncture bits from the set of coded bits according to a first puncturing pattern to obtain a first subset of the set of coded bits, and transmit the first subset of the set of coded bits in a first transmission. The equivalent puncture set encoder/decoder 1310 may puncture bits from the set of coded bits according to a second puncturing pattern to obtain a second subset of the set of coded bits, where the second puncturing pattern is derived from the first puncturing pattern, and may transmit the second subset of the set of coded bits in a second transmission.

Additionally or alternatively, the equivalent puncture set encoder/decoder 1310 may receive, in a first transmission associated with a set of information bits, first information corresponding to a first subset of a set of coded bits, where the first subset of the set of coded bits is based on the set of coded bits and a first puncturing pattern. The equivalent puncture set encoder/decoder 1310 may also receive, in a second transmission associated with the set of information bits, second information corresponding to a second subset of the set of coded bits, where the second subset of the set of coded bits is based on the set of coded bits and a second puncturing pattern, and where the second puncturing pattern is derived from the first puncturing pattern. The equivalent puncture set encoder/decoder 1310 may combine the first information and the second information to obtain combined information for the set of coded bits and may perform a decoding process according to the polar code on the combined information.

The I/O controller 1315 may manage input and output signals for the device 1305. The I/O controller 1315 may also manage peripherals not integrated into the device 1305. In some cases, the I/O controller 1315 may represent a physical connection or port to an external peripheral. In some cases, the I/O controller 1315 may utilize an operating system such as iOS®, ANDROID®, MS-DOS®, MS-WIN-DOWS®, OS/2®, UNIX®, LINUX®, or another known operating system. In other cases, the I/O controller 1315 may represent or interact with a modem, a keyboard, a mouse, a touchscreen, or a similar device. In some cases, the I/O controller 1315 may be implemented as part of a processor. In some cases, a user may interact with the device 1305 via the I/O controller 1315 or via hardware components controlled by the I/O controller 1315.

The transceiver 1320 may communicate bi-directionally, via one or more antennas, wired, or wireless links as described above. For example, the transceiver 1320 may represent a wireless transceiver and may communicate bi-directionally with another wireless transceiver. The transceiver 1320 may also include a modem to modulate the packets and provide the modulated packets to the antennas for transmission, and to demodulate packets received from the antennas.

In some cases, the wireless device may include a single antenna 1325. However, in some cases the device may have more than one antenna 1325, which may be capable of concurrently transmitting or receiving multiple wireless transmissions.

The memory 1330 may include random-access memory (RAM) and read-only memory (ROM). The memory 1330 may store computer-readable, computer-executable code 1335 including instructions that, when executed, cause the processor to perform various functions described herein. In some cases, the memory 1330 may contain, among other things, a basic I/O system (BIOS) which may control basic hardware or software operation such as the interaction with peripheral components or devices.

The processor 1340 may include an intelligent hardware device (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, the processor 1340 may be configured to operate a memory array using a memory controller. In other cases, a memory controller may be integrated into the processor 1340. The processor 1340 may be configured to execute computer-readable instructions stored in a memory (e.g., the memory 1330) to cause the device 1305 to perform various functions (e.g., functions or tasks supporting equivalent puncture sets for polar coded re-transmissions).

The code 1335 may include instructions to implement aspects of the present disclosure, including instructions to support wireless communications. The code 1335 may be stored in a non-transitory computer-readable medium such as system memory or other type of memory. In some cases, the code 1335 may not be directly executable by the processor 1340 but may cause a computer (e.g., when compiled and executed) to perform functions described herein.

Figure 14:
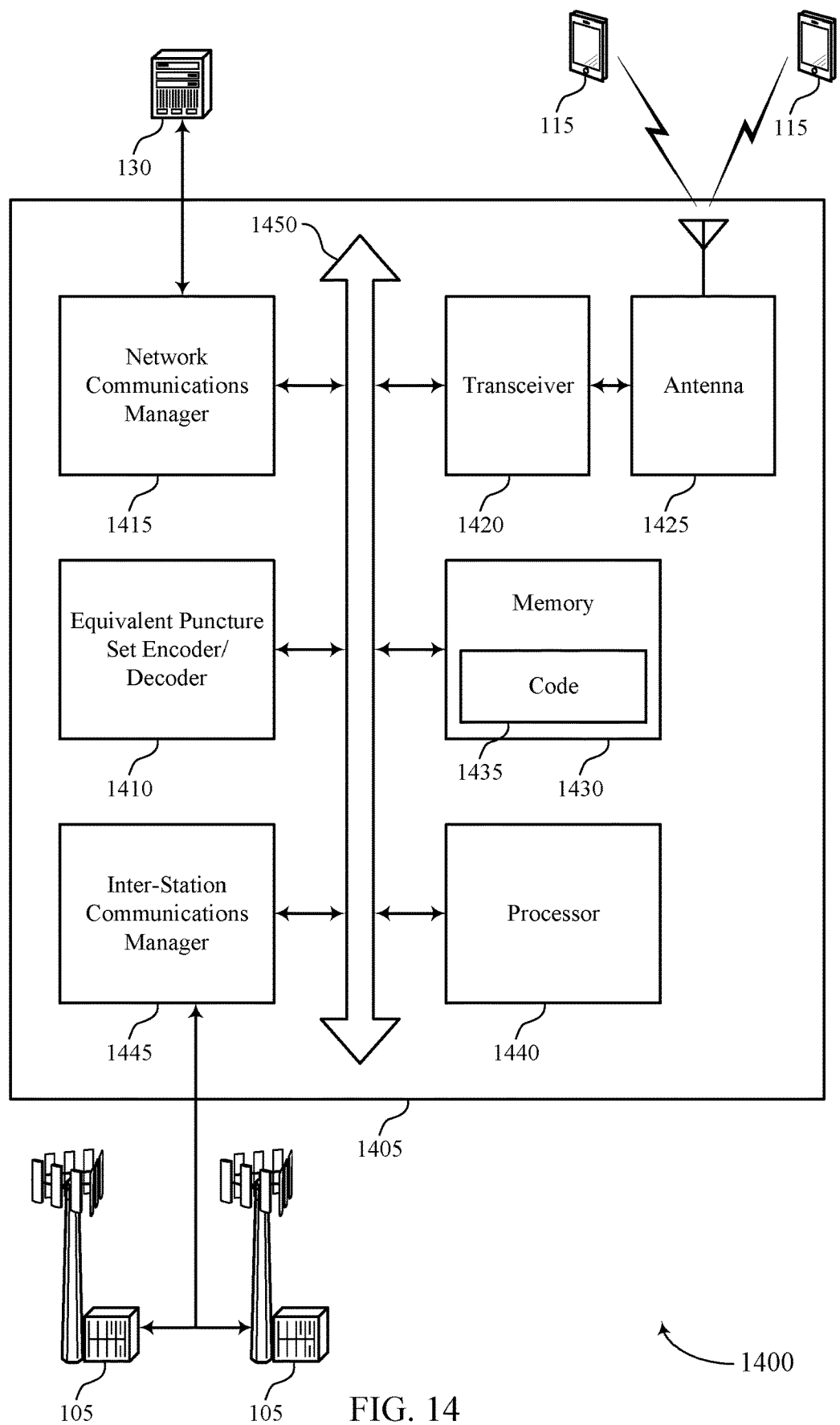

FIG. 14 shows a diagram of a system 1400 including a device 1405 that supports equivalent puncture sets for polar coded re-transmissions in accordance with aspects of the present disclosure. The device 1405 may be an example of or include the components of device 705, device 805, device 1005, device 1105, a UE 115, or a base station 105 as described herein. The device 1405 may include components for bi-directional voice and data communications including components for transmitting and receiving communications, including an equivalent puncture set encoder/decoder 1410, a network communications manager 1415, a transceiver 1420, an antenna 1425, memory 1430, a processor 1440, and an inter-station communications manager 1445. These components may be in electronic communication via one or more buses (e.g., bus 1450).

In some cases, the equivalent puncture set encoder/decoder 1410 may perform an encoding process according to a polar code on a set of information bits to determine a set of coded bits, puncture bits from the set of coded bits according to a first puncturing pattern to obtain a first subset of the set of coded bits, and transmit the first subset of the set of coded bits in a first transmission. The equivalent puncture set encoder/decoder 1410 may puncture bits from the set of coded bits according to a second puncturing pattern to obtain a second subset of the set of coded bits, where the second puncturing pattern is derived from the first puncturing pattern, and may transmit the second subset of the set of coded bits in a second transmission.

Additionally or alternatively, the equivalent puncture set encoder/decoder 1410 may receive, in a first transmission associated with a set of information bits, first information corresponding to a first subset of a set of coded bits, where the first subset of the set of coded bits is based on the set of coded bits and a first puncturing pattern. The equivalent puncture set encoder/decoder 1410 may also receive, in a second transmission associated with the set of information bits, second information corresponding to a second subset of the set of coded bits, where the second subset of the set of coded bits is based on the set of coded bits and a second puncturing pattern, and where the second puncturing pattern is derived from the first puncturing pattern. The equivalent puncture set encoder/decoder 1410 may combine the first information and the second information to obtain combined information for the set of coded bits and may perform a decoding process according to the polar code on the combined information.

The network communications manager 1415 may manage communications with the core network 130 (e.g., via one or more wired backhaul links). For example, the network communications manager 1415 may manage the transfer of data communications for client devices, such as one or more UEs 115.

The transceiver 1420 may communicate bi-directionally, via one or more antennas, wired, or wireless links as described above. For example, the transceiver 1420 may represent a wireless transceiver and may communicate bi-directionally with another wireless transceiver. The transceiver 1420 may also include a modem to modulate the packets and provide the modulated packets to the antennas for transmission, and to demodulate packets received from the antennas.

In some cases, the wireless device may include a single antenna 1425. However, in some cases the device may have more than one antenna 1425, which may be capable of concurrently transmitting or receiving multiple wireless transmissions.

The memory 1430 may include RAM, ROM, or a combination thereof. The memory 1430 may store computer-readable code 1435 including instructions that, when executed by a processor (e.g., the processor 1440) cause the device to perform various functions described herein. In some cases, the memory 1430 may contain, among other things, a BIOS which may control basic hardware or software operation such as the interaction with peripheral components or devices.

The processor 1440 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1440 may be configured to operate a memory array using a memory controller. In some cases, a memory controller may be integrated into processor 1440. The processor 1440 may be configured to execute computer-readable instructions stored in a memory (e.g., the memory 1430) to cause the device 1405 to perform various functions (e.g., functions or tasks supporting equivalent puncture sets for polar coded re-transmissions).

The inter-station communications manager 1445 may manage communications with other base station 105 and may include a controller or scheduler for controlling communications with UEs 115 in cooperation with other base stations 105. For example, the inter-station communications manager 1445 may coordinate scheduling for transmissions to UEs 115 for various interference mitigation techniques such as beamforming or joint transmission. In some examples, the inter-station communications manager 1445 may provide an X2 interface within an LTE/LTE-A wireless communication network technology to provide communication between base stations 105.

The code 1435 may include instructions to implement aspects of the present disclosure, including instructions to support wireless communications. The code 1435 may be stored in a non-transitory computer-readable medium such as system memory or other type of memory. In some cases, the code 1435 may not be directly executable by the processor 1440 but may cause a computer (e.g., when compiled and executed) to perform functions described herein.

Figure 15:
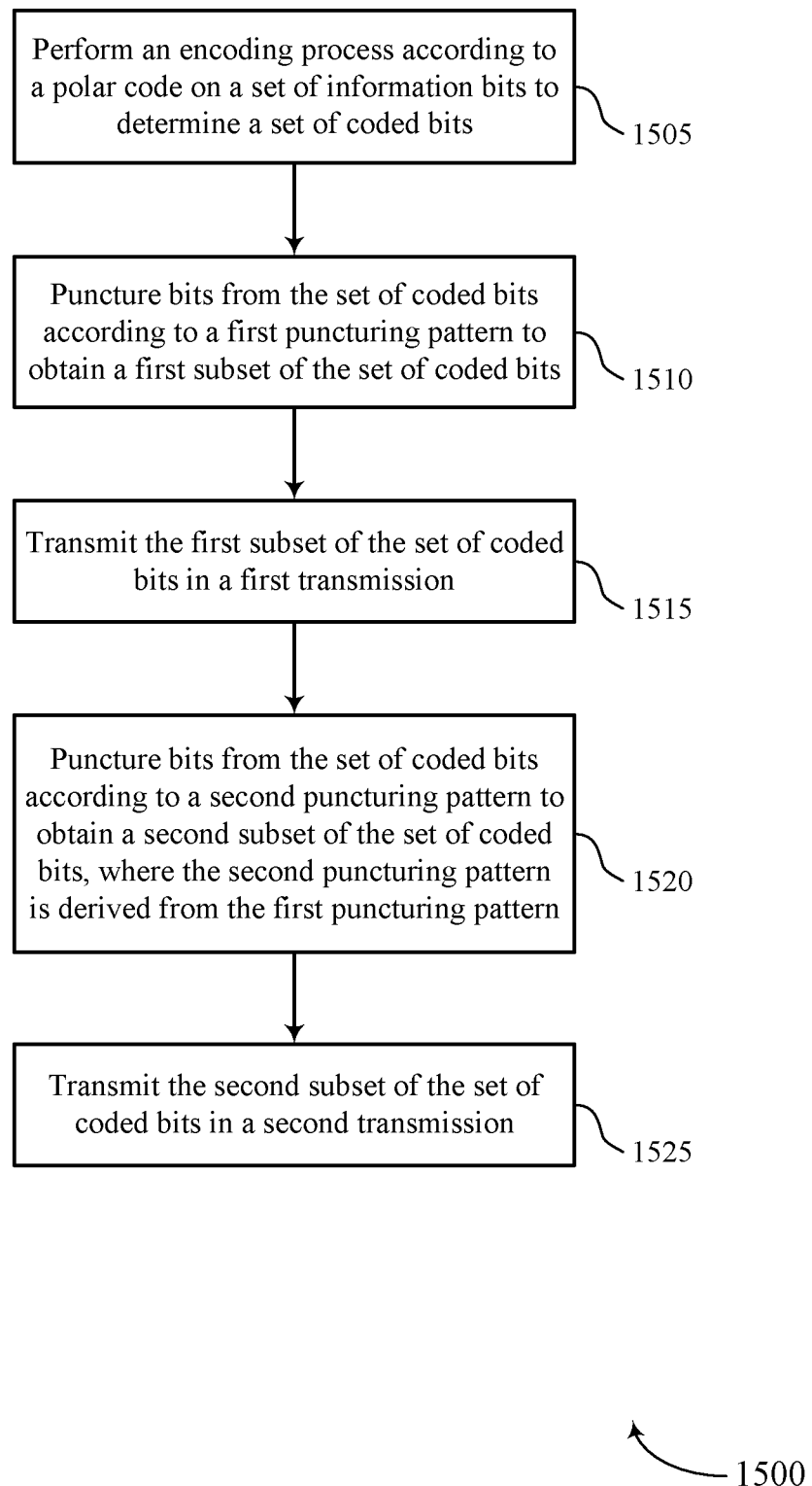
FIGS. 15 through 19 show flowcharts illustrating methods that support equivalent puncture sets for polar coded re-transmissions in accordance with aspects of the present disclosure.

FIG. 15 shows a flowchart illustrating a method 1500 that supports equivalent puncture sets for polar coded re-transmissions in accordance with aspects of the present disclosure. The operations of method 1500 may be implemented by a base station 105, a UE 115, or their components as described herein. For example, the operations of method 1500 may be performed by an equivalent puncture set encoder as described with reference to FIGS. 7 through 9, 13, and 14. In some examples, a wireless device (e.g., a base station or UE) may execute a set of instructions to control the functional elements of the wireless device to perform the functions described below. Additionally or alternatively, a wireless device may perform aspects of the functions described below using special-purpose hardware.

At 1505, the wireless device may perform an encoding process according to a polar code on a set of information bits to determine a set of coded bits. The operations of 1505 may be performed according to the methods described herein. In some examples, aspects of the operations of 1505 may be performed by a polar encoding component as described with reference to FIGS. 7 through 9, 13, and 14.

At 1510, the wireless device may puncture bits from the set of coded bits according to a first puncturing pattern to obtain a first subset of the set of coded bits. The operations of 1510 may be performed according to the methods described herein. In some examples, aspects of the operations of 1510 may be performed by a bit puncturing component as described with reference to FIGS. 7 through 9, 13, and 14.

At 1515, the wireless device may transmit the first subset of the set of coded bits in a first transmission. The operations of 1515 may be performed according to the methods described herein. In some examples, aspects of the operations of 1515 may be performed by a transmission component as described with reference to FIGS. 7 through 9, 13, and 14.

At 1520, the wireless device may puncture bits from the set of coded bits according to a second puncturing pattern to obtain a second subset of the set of coded bits, where the second puncturing pattern is derived from the first puncturing pattern. The second puncturing pattern and the first puncturing may be examples of "equivalent" puncture sets. The operations of 1520 may be performed according to the methods described herein. In some examples, aspects of the operations of 1520 may be performed by a bit puncturing component as described with reference to FIGS. 7 through 9, 13, and 14.

At 1525, the wireless device may transmit the second subset of the set of coded bits in a second transmission. The operations of 1525 may be performed according to the methods described herein. In some examples, aspects of the operations of 1525 may be performed by a transmission component as described with reference to FIGS. 7 through 9, 13, and 14.

Figure 16:
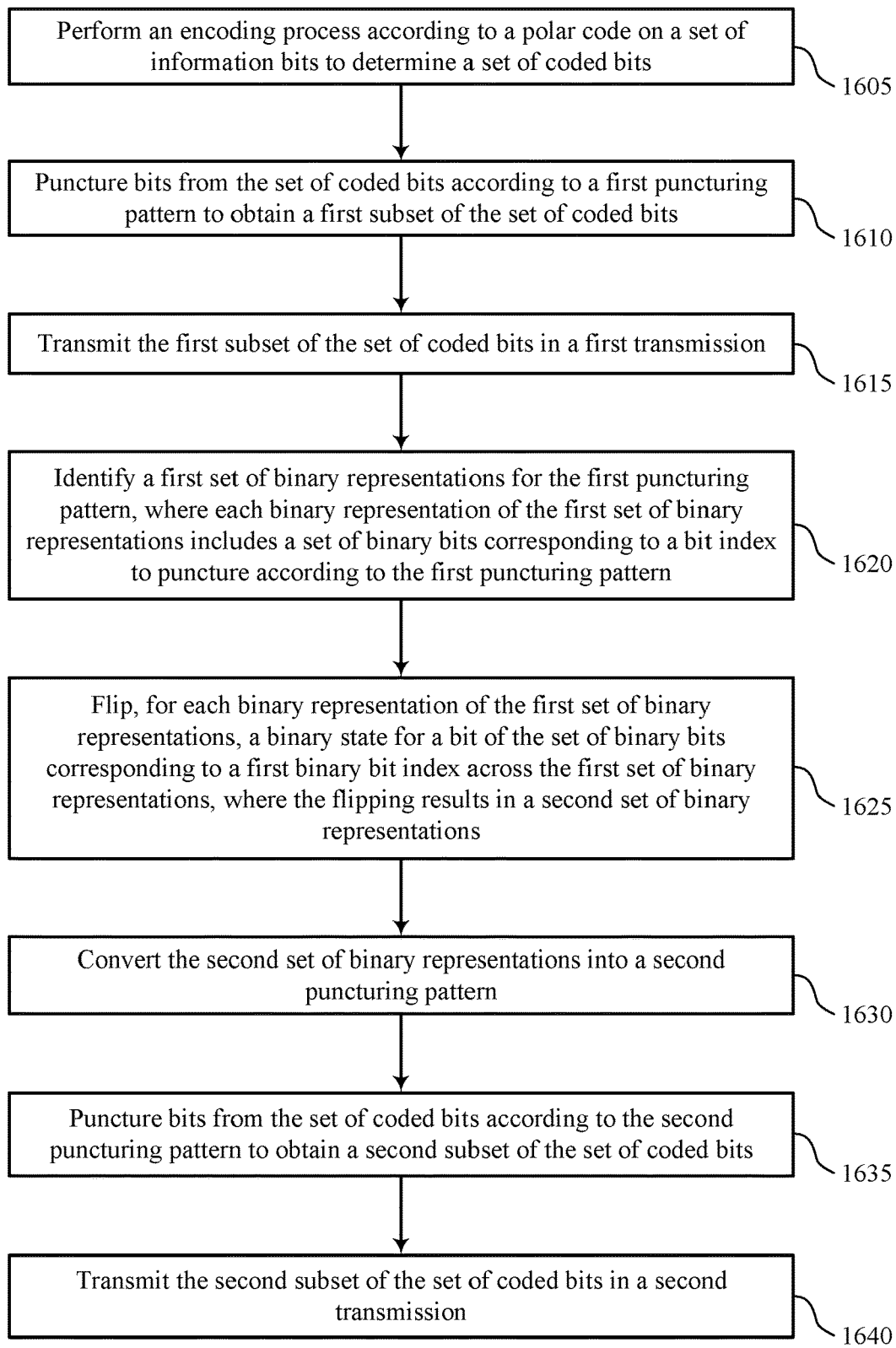

FIG. 16 shows a flowchart illustrating a method 1600 that supports equivalent puncture sets for polar coded re-transmissions in accordance with aspects of the present disclosure. The operations of method 1600 may be implemented by a base station 105, a UE 115, or their components as described herein. For example, the operations of method 1600 may be performed by an equivalent puncture set encoder as described with reference to FIGS. 7 through 9, 13, and 14. In some examples, a wireless device (e.g., a base station or a UE) may execute a set of instructions to control the functional elements of the wireless device to perform the functions described below. Additionally or alternatively, a wireless device may perform aspects of the functions described below using special-purpose hardware.

At 1605, the wireless device may perform an encoding process according to a polar code on a set of information bits to determine a set of coded bits. The operations of 1605 may be performed according to the methods described herein. In some examples, aspects of the operations of 1605 may be performed by a polar encoding component as described with reference to FIGS. 7 through 9, 13, and 14.

At 1610, the wireless device may puncture bits from the set of coded bits according to a first puncturing pattern to obtain a first subset of the set of coded bits. The operations of 1610 may be performed according to the methods described herein. In some examples, aspects of the operations of 1610 may be performed by a bit puncturing component as described with reference to FIGS. 7 through 9, 13, and 14.

At 1615, the wireless device may transmit the first subset of the set of coded bits in a first transmission. The operations of 1615 may be performed according to the methods described herein. In some examples, aspects of the operations of 1615 may be performed by a transmission component as described with reference to FIGS. 7 through 9, 13, and 14.

The wireless device may determine a second puncturing pattern based on the first puncturing pattern. For example, at 1620, the wireless device may identify a first set of binary representations for the first puncturing pattern, where each binary representation of the first set of binary representations includes a set of binary bits corresponding to a bit index to puncture according to the first puncturing pattern. The operations of 1620 may be performed according to the methods described herein. In some examples, aspects of the operations of 1620 may be performed by a punctured index manipulation component as described with reference to FIGS. 7 through 9, 13, and 14.

At 1625, the wireless device may flip, for each binary representation of the first set of binary representations, a binary state for a bit of the set of binary bits corresponding to a first binary bit index across the first set of binary representations, where the flipping results in a second set of binary representations. The operations of 1625 may be performed according to the methods described herein. In some examples, aspects of the operations of 1625 may be performed by a punctured index manipulation component as described with reference to FIGS. 7 through 9, 13, and 14.

At 1630, the wireless device may convert the second set of binary representations into the second puncturing pattern. The operations of 1630 may be performed according to the methods described herein. In some examples, aspects of the operations of 1630 may be performed by a punctured index manipulation component as described with reference to FIGS. 7 through 9, 13, and 14.

At 1635, the wireless device may puncture bits from the set of coded bits according to the second puncturing pattern to obtain a second subset of the set of coded bits. The operations of 1635 may be performed according to the methods described herein. In some examples, aspects of the operations of 1635 may be performed by a bit puncturing component as described with reference to FIGS. 7 through 9, 13, and 14.

At 1640, the wireless device may transmit the second subset of the set of coded bits in a second transmission. The operations of 1640 may be performed according to the methods described herein. In some examples, aspects of the operations of 1640 may be performed by a transmission component as described with reference to FIGS. 7 through 9, 13, and 14.

Figure 17:
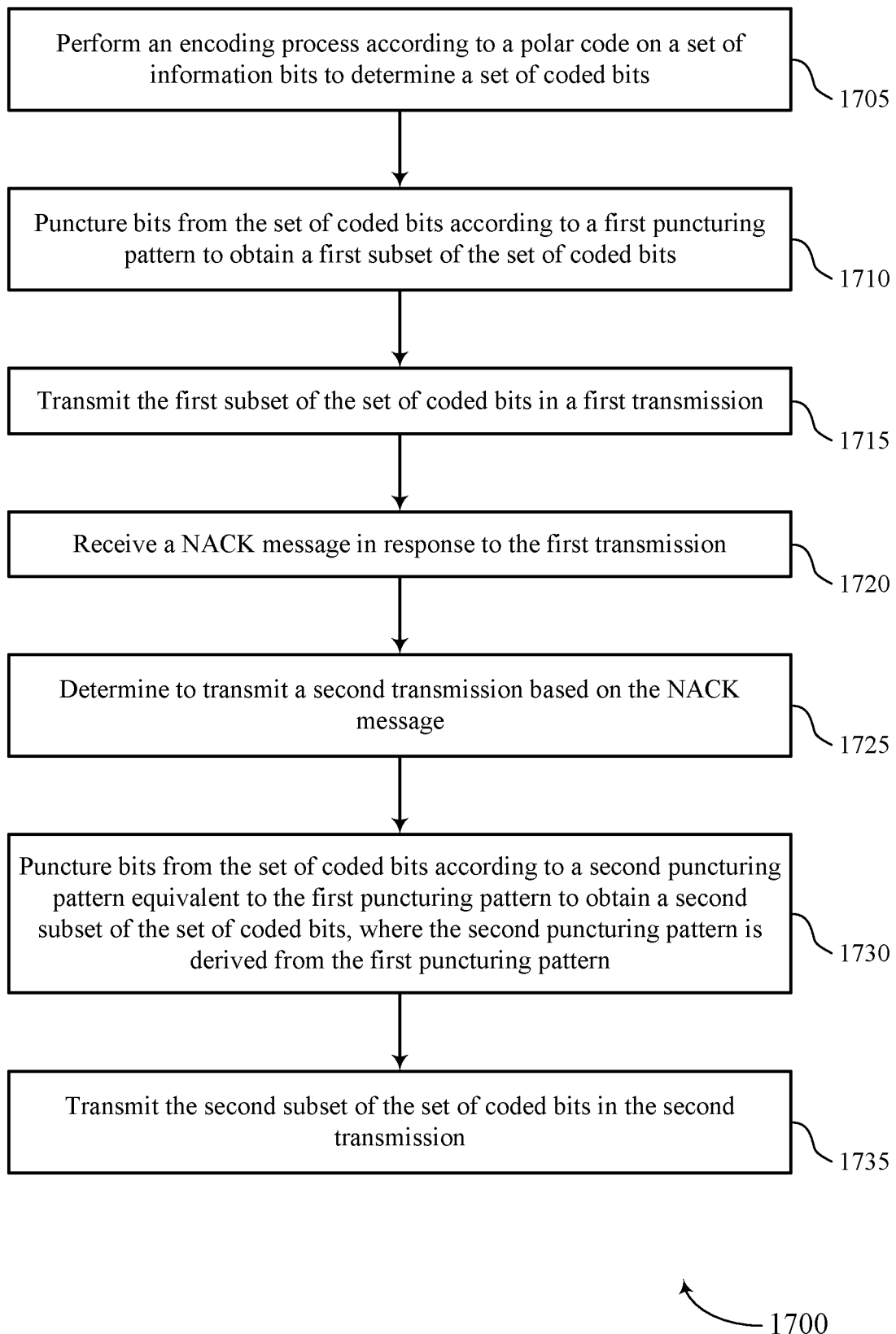

FIG. 17 shows a flowchart illustrating a method 1700 that supports equivalent puncture sets for polar coded re-transmissions in accordance with aspects of the present disclosure. The operations of method 1700 may be implemented by a base station 105, a UE 115, or their components as described herein. For example, the operations of method 1700 may be performed by an equivalent puncture set encoder as described with reference to FIGS. 7 through 9, 13, and 14. In some examples, a wireless device (e.g., a base station or UE) may execute a set of instructions to control the functional elements of the wireless device to perform the functions described below. Additionally or alternatively, a wireless device may perform aspects of the functions described below using special-purpose hardware.

At 1705, the wireless device may perform an encoding process according to a polar code on a set of information bits to determine a set of coded bits. The operations of 1705 may be performed according to the methods described herein. In some examples, aspects of the operations of 1705 may be performed by a polar encoding component as described with reference to FIGS. 7 through 9, 13, and 14.

At 1710, the wireless device may puncture bits from the set of coded bits according to a first puncturing pattern to obtain a first subset of the set of coded bits. The operations of 1710 may be performed according to the methods described herein. In some examples, aspects of the operations of 1710 may be performed by a bit puncturing component as described with reference to FIGS. 7 through 9, 13, and 14.

At 1715, the wireless device may transmit the first subset of the set of coded bits in a first transmission. The operations of 1715 may be performed according to the methods described herein. In some examples, aspects of the operations of 1715 may be performed by a transmission component as described with reference to FIGS. 7 through 9, 13, and 14.

At 1720, the wireless device may receive a NACK message in response to the first transmission. The operations of 1720 may be performed according to the methods described herein. In some examples, aspects of the operations of 1720 may be performed by a HARQ component as described with reference to FIGS. 7 through 13.

At 1725, the wireless device may determine to transmit a second transmission based on the NACK message. The operations of 1725 may be performed according to the methods described herein. In some examples, aspects of the operations of 1725 may be performed by a HARQ component as described with reference to FIGS. 7 through 9, 13, and 14.

At 1730, the wireless device may puncture bits from the set of coded bits according to a second puncturing pattern to obtain a second subset of the set of coded bits, where the second puncturing pattern is derived from the first puncturing pattern. The operations of 1730 may be performed according to the methods described herein. In some examples, aspects of the operations of 1730 may be performed by a bit puncturing component as described with reference to FIGS. 7 through 9, 13, and 14.

At 1735, the wireless device may transmit the second subset of the set of coded bits in the second transmission. The operations of 1735 may be performed according to the methods described herein. In some examples, aspects of the operations of 1735 may be performed by a transmission component as described with reference to FIGS. 7 through 9, 13, and 14.

Figure 18:
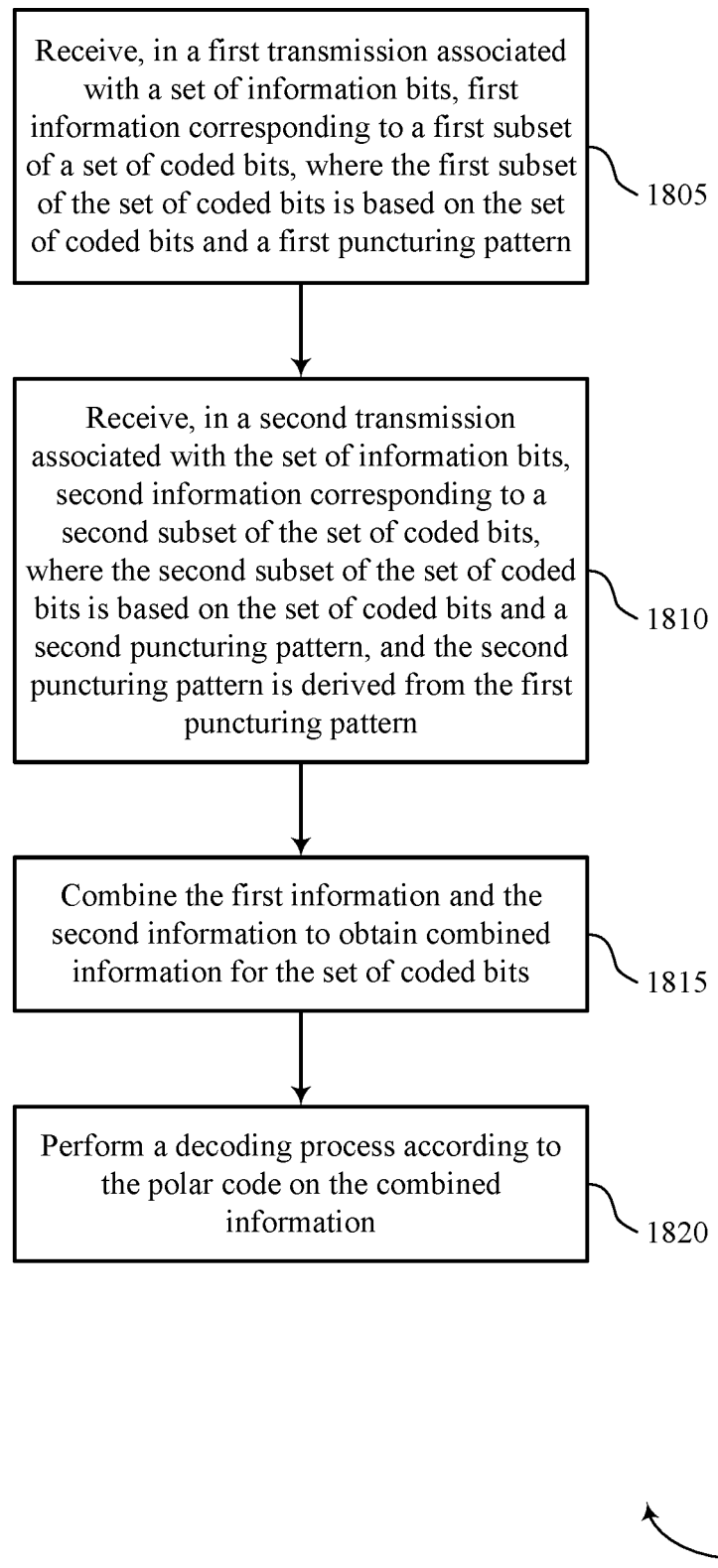

FIG. 18 shows a flowchart illustrating a method 1800 that supports equivalent puncture sets for polar coded re-transmissions in accordance with aspects of the present disclosure. The operations of method 1800 may be implemented by a UE 115, a base station 105, or their components as described herein. For example, the operations of method 1800 may be performed by an equivalent puncture set decoder as described with reference to FIGS. 10 through 14. In some examples, a wireless device (e.g., a UE or base station) may execute a set of instructions to control the functional elements of the wireless device to perform the functions described below. Additionally or alternatively, a wireless device may perform aspects of the functions described below using special-purpose hardware.

At 1805, the wireless device may receive, in a first transmission associated with a set of information bits, first information corresponding to a first subset of a set of coded bits, where the first subset of the set of coded bits is based on the set of coded bits and a first puncturing pattern. The operations of 1805 may be performed according to the methods described herein. In some examples, aspects of the operations of 1805 may be performed by a reception component as described with reference to FIGS. 10 through 14.

At 1810, the wireless device may receive, in a second transmission associated with the set of information bits, second information corresponding to a second subset of the set of coded bits, where the second subset of the set of coded bits is based on the set of coded bits and a second puncturing pattern, and where the second puncturing pattern is derived from the first puncturing pattern. The operations of 1810 may be performed according to the methods described herein. In some examples, aspects of the operations of 1810 may be performed by a reception component as described with reference to FIGS. 10 through 14.

At 1815, the wireless device may combine the first information and the second information to obtain combined information for the set of coded bits. The operations of 1815 may be performed according to the methods described herein. In some examples, aspects of the operations of 1815 may be performed by a combination component as described with reference to FIGS. 10 through 14.

At 1820, the wireless device may perform a decoding process according to a polar code on the combined information. The operations of 1820 may be performed according to the methods described herein. In some examples, aspects of the operations of 1820 may be performed by a polar decoding component as described with reference to FIGS. 10 through 14.

Figure 19:
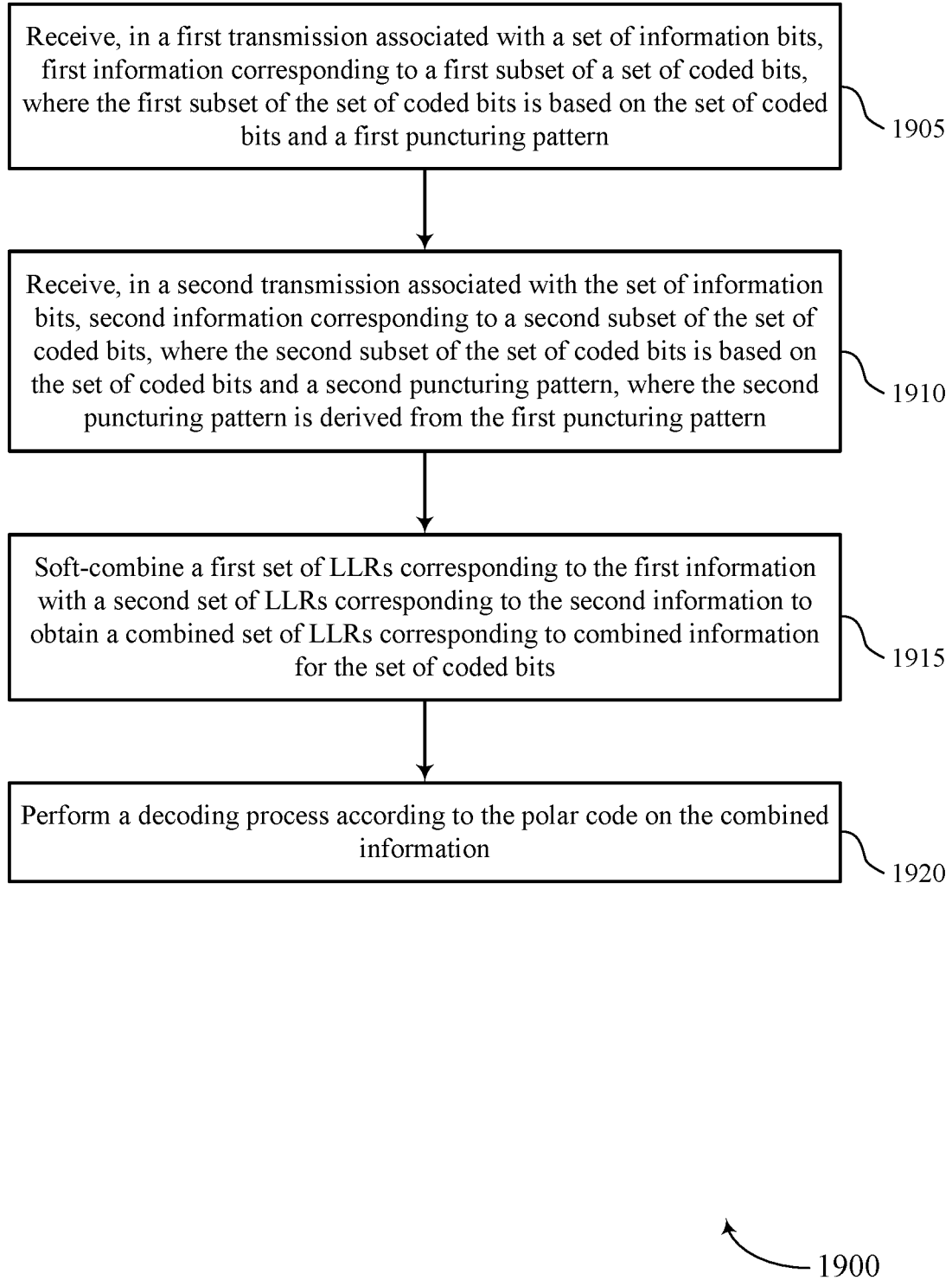

FIG. 19 shows a flowchart illustrating a method 1900 that supports equivalent puncture sets for polar coded re-transmissions in accordance with aspects of the present disclosure. The operations of method 1900 may be implemented by a UE 115, a base station 105, or their components as described herein. For example, the operations of method 1900 may be performed by an equivalent puncture set decoder as described with reference to FIGS. 10 through 14. In some examples, a wireless device (e.g., a UE or base station) may execute a set of instructions to control the functional elements of the wireless device to perform the functions described below. Additionally or alternatively, a wireless device may perform aspects of the functions described below using special-purpose hardware.

At 1905, the wireless device may receive, in a first transmission associated with a set of information bits, first information corresponding to a first subset of a set of coded bits, where the first subset of the set of coded bits is based on the set of coded bits and a first puncturing pattern. The operations of 1905 may be performed according to the methods described herein. In some examples, aspects of the operations of 1905 may be performed by a reception component as described with reference to FIGS. 10 through 14.

At 1910, the wireless device may receive, in a second transmission associated with the set of information bits, second information corresponding to a second subset of the set of coded bits, where the second subset of the set of coded bits is based on the set of coded bits and a second puncturing pattern, and where the second puncturing pattern is derived from the first puncturing pattern. The operations of 1910 may be performed according to the methods described herein. In some examples, aspects of the operations of 1910 may be performed by a reception component as described with reference to FIGS. 10 through 14.

At 1915, the wireless device may combine the first information and the second information to obtain combined information for the set of coded bits. In some cases, combining the first information and the second information to obtain the combined information may involve the wireless device soft-combining a first set of LLRs corresponding to the first information with a second set of LLRs corresponding to the second information to obtain a combined set of LLRs corresponding to the combined information. The operations of 1915 may be performed according to the methods described herein. In some examples, aspects of the operations of 1915 may be performed by an LLR soft-combining component as described with reference to FIGS. 10 through 14.

At 1920, the wireless device may perform a decoding process according to a polar code on the combined information (e.g., the combined set of LLRs). The operations of 1920 may be performed according to the methods described herein. In some examples, aspects of the operations of 1920 may be performed by a polar decoding component as described with reference to FIGS. 10 through 14.

Described below are a number of embodiments of methods, systems or apparatuses including means for implementing methods or realizing apparatuses, non-transitory computer-readable medium storing instructions executable by one or more processors to cause the one or more processors to implement methods, and systems including one or more processors and memory coupled with the one or more processors storing instructions executable by the one or more processors to cause the system or apparatus to implement methods. It is to be understood that these are just some examples of possible embodiments, and other examples will be readily apparent to those skilled in the art without departing from the scope of the disclosure.

Embodiment 1: A method for wireless communications, comprising: performing an encoding process according to a polar code on a set of information bits to determine a set of coded bits; puncturing bits from the set of coded bits according to a first puncturing pattern to obtain a first subset of the set of coded bits; transmitting the first subset of the set of coded bits in a first transmission; puncturing bits from the set of coded bits according to a second puncturing pattern to obtain a second subset of the set of coded bits, wherein the second puncturing pattern is derived from the first puncturing pattern; and transmitting the second subset of the set of coded bits in a second transmission.

Embodiment 2: The method of embodiment 1, wherein the second subset of the set of coded bits has an equivalent decoding performance as the first subset of the set of coded bits for the polar code.

Embodiment 3: The method of either of embodiments 1 or 2, further comprising: determining the second puncturing pattern based on the first puncturing pattern, wherein determining the second puncturing pattern comprises: identifying a first set of binary representations for the first puncturing pattern, wherein each binary representation of the first set of binary representations comprises a set of binary bits corresponding to a bit index to puncture according to the first puncturing pattern; flipping, for the each binary representation of the first set of binary representations, a binary state for a bit of the set of binary bits corresponding to a first binary bit index across the first set of binary representations, wherein the flipping results in a second set of binary representations; and converting the second set of binary representations into the second puncturing pattern.

Embodiment 4: The method of embodiment 3, further comprising: determining a third puncturing pattern based on the first puncturing pattern, wherein determining the third puncturing pattern comprises: flipping, for the each binary representation of the first set of binary representations, a binary state for a different bit of the set of binary bits corresponding to a second binary bit index across the first set of binary representations, wherein the flipping results in a third set of binary representations; and converting the third set of binary representations into the third puncturing pattern.

Embodiment 5: The method of embodiment 4, further comprising: puncturing bits from the set of coded bits according to the third puncturing pattern to obtain a third subset of the set of coded bits, wherein the third subset of the set of coded bits has an equivalent decoding performance as the first subset of the set of coded bits and the second subset of the set of coded bits for the polar code; and transmitting the third subset of the set of coded bits in a third transmission.

Embodiment 6: The method of embodiment 3, further comprising: determining a third puncturing pattern based on the first puncturing pattern, wherein determining the third puncturing pattern comprises: flipping, for the each binary representation of the first set of binary representations, binary states for a set of bits of the set of binary bits corresponding to a first set of binary bit indices across the first set of binary representations, wherein the flipping results in a third set of binary representations; and converting the third set of binary representations into the third puncturing pattern.

Embodiment 7: The method of embodiment 6, further comprising: puncturing bits from the set of coded bits according to the third puncturing pattern to obtain a third subset of the set of coded bits, wherein the third subset of the set of coded bits has an equivalent decoding performance as the first subset of the set of coded bits and the second subset of the set of coded bits for the polar code; and transmitting the third subset of the set of coded bits in a third transmission.

Embodiment 8: The method of any of embodiments 1 to 7, further comprising: determining the first puncturing pattern based on a size of the set of information bits, a size of the set of coded bits, a size of the first subset of the set of coded bits, or a combination thereof.

Embodiment 9: The method of any of embodiments 1 to 8, further comprising: receiving a NACK message in response to the first transmission and determining to transmit the second transmission based on the NACK message.

Embodiment 10: The method of any of embodiments 1 to 9, further comprising: determining to transmit the second transmission based on a pre-configuration or a received configuration message.

Embodiment 11: An apparatus comprising at least one means for performing a method of any of embodiments 1 to 10.

Embodiment 12: An apparatus for wireless communications comprising a processor; memory in electronic communication with the processor; and instructions stored in the memory and executable by the processor to cause the apparatus to perform a method of any of embodiments 1 to 10.

Embodiment 13: A non-transitory computer-readable medium storing code for wireless communications, the code comprising instructions executable by a processor to perform a method of any of embodiments 1 to 10.

Embodiment 14: A method for wireless communications, comprising: receiving, in a first transmission associated with a set of information bits, first information corresponding to a first subset of a set of coded bits, wherein the first subset of the set of coded bits is based on the set of coded bits and a first puncturing pattern; receiving, in a second transmission associated with the set of information bits, second information corresponding to a second subset of the set of coded bits, wherein the second subset of the set of coded bits is based on the set of coded bits and a second puncturing pattern, wherein the second puncturing pattern is derived from the first puncturing pattern; combining the first information and the second information to obtain combined information for the set of coded bits; and performing a decoding process according to a polar code on the combined information.

Embodiment 15: The method of embodiment 14, wherein the second subset of the set of coded bits has an equivalent decoding performance as the first subset of the set of coded bits for the polar code.

Embodiment 16: The method of either of embodiments 14 or 15, further comprising: determining the set of information bits based on the decoding process.

Embodiment 17: The method of any of embodiments 14 to 16, further comprising: determining the second puncturing pattern based on the first puncturing pattern, wherein determining the second puncturing pattern comprises: identifying a first set of binary representations for the first puncturing pattern, wherein each binary representation of the first set of binary representations comprises a set of binary bits corresponding to a bit index to puncture according to the first puncturing pattern; flipping, for the each binary representation of the first set of binary representations, a binary state for a bit of the set of binary bits corresponding to a first binary bit index across the first set of binary representations, wherein the flipping results in a second set of binary representations; and converting the second set of binary representations into the second puncturing pattern.

Embodiment 18: The method of embodiment 17, further comprising: determining a third puncturing pattern based on the first puncturing pattern, wherein determining the third puncturing pattern comprises: flipping, for the each binary representation of the first set of binary representations, a binary state for a different bit of the set of binary bits corresponding to a second binary bit index across the first set of binary representations, wherein the flipping results in a third set of binary representations; and converting the third set of binary representations into the third puncturing pattern.

Embodiment 19: The method of embodiment 18, further comprising: receiving, in a third transmission associated with the set of information bits, third information corresponding to a third subset of the set of coded bits, wherein the third subset of the set of coded bits is based on the set of coded bits and the third puncturing pattern, and wherein the third subset of the set of coded bits has an equivalent decoding performance as the first subset of the set of coded bits and the second subset of the set of coded bits for the polar code; combining the first information, the second information, and the third information to obtain second combined information for the set of coded bits; and performing a second decoding process according to the polar code on the second combined information.

Embodiment 20: The method of embodiment 17, further comprising: determining a third puncturing pattern based on the first puncturing pattern, wherein determining the third puncturing pattern comprises: flipping, for the each binary representation of the first set of binary representations, binary states for a set of bits of the set of binary bits corresponding to a first set of binary bit indices across the first set of binary representations, wherein the flipping results in a third set of binary representations; and converting the third set of binary representations into the third puncturing pattern.

Embodiment 21: The method of embodiment 20, further comprising: receiving, in a third transmission associated with the set of information bits, third information corresponding to a third subset of the set of coded bits, wherein the third subset of the set of coded bits is based on the set of coded bits and the third puncturing pattern, and wherein the third subset of the set of coded bits has an equivalent decoding performance as the first subset of the set of coded bits and the second subset of the set of coded bits for the polar code; combining the first information, the second information, and the third information to obtain second combined information for the set of coded bits; and performing a second decoding process according to the polar code on the second combined information.

Embodiment 22: The method of any of embodiments 14 to 21, further comprising: determining the first puncturing pattern based on a size of the set of information bits, a size of the set of coded bits, a size of the first subset of the set of coded bits, or a combination thereof.

Embodiment 23: The method of any of embodiments 14 to 22, wherein combining the first information and the second information to obtain the combined information comprises: soft-combining a first set of LLRs corresponding to the first information with a second set of LLRs corresponding to the second information to obtain a combined set of LLRs corresponding to the combined information.

Embodiment 24: The method of embodiment 23, wherein soft-combining the first set of LLRs corresponding to the first information with the second set of LLRs corresponding to the second information further comprises: adding LLRs from the first set of LLRs to LLRs from the second set of LLRs that correspond to same bits of the set of coded bits.

Embodiment 25: The method of any of embodiments 14 to 24, further comprising: performing an unsuccessful decoding process according to the polar code on the first information, wherein performing the decoding process according to the polar code on the combined information is based on the unsuccessful decoding process.

Embodiment 26: The method of embodiment 25, further comprising: transmitting a NACK message in response to the first transmission based on the unsuccessful decoding process, wherein the second transmission is received based on the NACK message.

Embodiment 27: An apparatus comprising at least one means for performing a method of any of embodiments 14 to 26.

Embodiment 28: An apparatus for wireless communications comprising a processor; memory in electronic communication with the processor; and instructions stored in the memory and executable by the processor to cause the apparatus to perform a method of any of embodiments 14 to 26.

Embodiment 29: A non-transitory computer-readable medium storing code for wireless communications, the code comprising instructions executable by a processor to perform a method of any of embodiments 14 to 26.

It should be noted that the methods described herein describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1×, 1×, etc. IS-856

(TIA-856) is commonly referred to as CDMA2000 1×EV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs 115 with service subscriptions with the network provider. A small cell may be associated with a lower-powered base station 105, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs 115 with service subscriptions with the network provider. A femto cell may also cover a small geographic area (e.g., a home) and may provide restricted access by UEs 115 having an association with the femto cell (e.g., UEs 115 in a closed subscriber group (CSG), UEs 115 for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications system 100 or systems described herein may support synchronous or asynchronous operation. For synchronous operation, the base stations 105 may have similar frame timing, and transmissions from different base stations 105 may be approximately aligned in time. For asynchronous operation, the base stations 105 may have different frame timing, and transmissions from different base stations 105 may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include RAM, ROM, electrically erasable programmable read only memory (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus for wireless communications, comprising:
    a processor;
    memory coupled with the processor; and
    instructions stored in the memory and executable by the processor to cause the apparatus to:
        receive, in a first transmission associated with a set of information bits, first information corresponding to a first subset of a set of coded bits, wherein the first subset of the set of coded bits is based at least in part on the set of coded bits and a first puncturing pattern;
        receive, in a second transmission associated with the set of information bits, second information corresponding to a second subset of the set of coded bits, wherein the second subset of the set of coded bits is based at least in part on the set of coded bits and a second puncturing pattern, wherein the second puncturing pattern is determined based at least in part on the first puncturing pattern, wherein the instructions executable to cause the apparatus to determine the second puncturing pattern are executable by the processor to cause the apparatus to:
            identify a first set of binary representations for the first puncturing pattern, wherein each binary representation of the first set of binary representations comprises a set of binary bits corresponding to a bit index to puncture according to the first puncturing pattern;
            flip, for the each binary representation of the first set of binary representations, a binary state for a bit of the set of binary bits corresponding to a first binary bit index across the first set of binary representations, wherein the flipping results in a second set of binary representations; and
            convert the second set of binary representations into the second puncturing pattern;
        combine the first information and the second information to obtain combined information for the set of coded bits; and
        perform a decoding process according to a polar code on the combined information for the set of coded bits.

2. The apparatus of claim 1, wherein the second subset of the set of coded bits has an equivalent decoding performance as the first subset of the set of coded bits for the polar code.

3. The apparatus of claim 1, wherein the instructions are further executable by the processor to cause the apparatus to:
    determine the set of information bits based at least in part on the decoding process.

4. The apparatus of claim 1, wherein the instructions are further executable by the processor to cause the apparatus to:
    determine a third puncturing pattern based at least in part on the first puncturing pattern, wherein the instructions executable to cause the apparatus to determine the third puncturing pattern are executable by the processor to cause the apparatus to:
        additionally flip, for the each binary representation of the first set of binary representations, a binary state for a different bit of the set of binary bits corresponding to a second binary bit index across the first set of binary representations, wherein the additional flipping results in a third set of binary representations; and
        convert the third set of binary representations into the third puncturing pattern.

5. The apparatus of claim 4, wherein the instructions are further executable by the processor to cause the apparatus to:
    receive, in a third transmission associated with the set of information bits, third information corresponding to a third subset of the set of coded bits, wherein the third subset of the set of coded bits is based at least in part on the set of coded bits and the third puncturing pattern, and wherein the third subset of the set of coded bits has an equivalent decoding performance as the first subset of the set of coded bits and the second subset of the set of coded bits for the polar code;
    combine the first information, the second information, and the third information to obtain second combined information for the set of coded bits; and
    perform a second decoding process according to the polar code on the second combined information for the set of coded bits.

6. The apparatus of claim 1, wherein the instructions are further executable by the processor to cause the apparatus to:
    determine a third puncturing pattern based at least in part on the first puncturing pattern, wherein the instructions executable to cause the apparatus to determine the third puncturing pattern are executable by the processor to cause the apparatus to:
        additionally flip, for the each binary representation of the first set of binary representations, binary states for a set of bits of the set of binary bits corresponding to a set of binary bit indices across all of the first set of binary representations, wherein the additional flipping results in a third set of binary representations; and
        convert the third set of binary representations into the third puncturing pattern.

7. The apparatus of claim 6, wherein the instructions are further executable by the processor to cause the apparatus to:
receive, in a third transmission associated with the set of information bits, third information corresponding to a third subset of the set of coded bits, wherein the third subset of the set of coded bits is based at least in part on the set of coded bits and the third puncturing pattern, and wherein the third subset of the set of coded bits has an equivalent decoding performance as the first subset of the set of coded bits and the second subset of the set of coded bits for the polar code;
combine the first information, the second information, and the third information to obtain second combined information for the set of coded bits; and
perform a second decoding process according to the polar code on the second combined information for the set of coded bits.

8. The apparatus of claim 1, wherein the instructions are further executable by the processor to cause the apparatus to:
determine the first puncturing pattern based at least in part on a size of the set of information bits, a size of the set of coded bits, a size of the first subset of the set of coded bits, or a combination thereof.

9. The apparatus of claim 1, wherein the instructions executable to cause the apparatus to combine the first information and the second information to obtain the combined information are executable by the processor to cause the apparatus to:
soft-combine a first set of log-likelihood ratios (LLRs) corresponding to the first information with a second set of LLRs corresponding to the second information to obtain a combined set of LLRs corresponding to the combined information.

10. The apparatus of claim 9, wherein the instructions executable to cause the apparatus to soft-combine the first set of LLRs corresponding to the first information with the second set of LLRs corresponding to the second information are executable by the processor to cause the apparatus to:
add LLRs from the first set of LLRs to LLRs from the second set of LLRs that correspond to same bits of the set of coded bits.

11. The apparatus of claim 1, wherein the instructions are further executable by the processor to cause the apparatus to:
perform an unsuccessful decoding process according to the polar code on the first information, wherein performing the decoding process according to the polar code on the combined information is based at least in part on the unsuccessful decoding process.

12. The apparatus of claim 11, wherein the instructions are further executable by the processor to cause the apparatus to:
transmit a negative acknowledgment (NACK) message in response to the first transmission based at least in part on the unsuccessful decoding process, wherein the second transmission is received based at least in part on the NACK message.

13. A method for wireless communications, comprising:
receiving, in a first transmission associated with a set of information bits, first information corresponding to a first subset of a set of coded bits, wherein the first subset of the set of coded bits is based at least in part on the set of coded bits and a first puncturing pattern;
receiving, in a second transmission associated with the set of information bits, second information corresponding to a second subset of the set of coded bits, wherein the second subset of the set of coded bits is based at least in part on the set of coded bits and a second puncturing pattern, wherein the second puncturing pattern is determined based at least in part on the first puncturing pattern, wherein determining the second puncturing pattern comprises:
identifying a first set of binary representations for the first puncturing pattern, wherein each binary representation of the first set of binary representations comprises a set of binary bits corresponding to a bit index to puncture according to the first puncturing pattern;
flipping, for the each binary representation of the first set of binary representations, a binary state for a bit of the set of binary bits corresponding to a first binary bit index across the first set of binary representations, wherein the flipping results in a second set of binary representations; and
converting the second set of binary representations into the second puncturing pattern;
combining the first information and the second information to obtain combined information for the set of coded bits; and
performing a decoding process according to a polar code on the combined information for the set of coded bits.

14. The method of claim 13, wherein the second subset of the set of coded bits has an equivalent decoding performance as the first subset of the set of coded bits for the polar code.

15. The method of claim 13, further comprising:
determining the set of information bits based at least in part on the decoding process.

16. The method of claim 13, further comprising:
determining a third puncturing pattern based at least in part on the first puncturing pattern, wherein determining the third puncturing pattern comprises:
additionally flipping, for the each binary representation of the first set of binary representations, a binary state for a different bit of the set of binary bits corresponding to a second binary bit index across the first set of binary representations, wherein the additional flipping results in a third set of binary representations; and
converting the third set of binary representations into the third puncturing pattern.

17. The method of claim 16, further comprising:
receiving, in a third transmission associated with the set of information bits, third information corresponding to a third subset of the set of coded bits, wherein the third subset of the set of coded bits is based at least in part on the set of coded bits and the third puncturing pattern, and wherein the third subset of the set of coded bits has an equivalent decoding performance as the first subset of the set of coded bits and the second subset of the set of coded bits for the polar code;
combining the first information, the second information, and the third information to obtain second combined information for the set of coded bits; and
performing a second decoding process according to the polar code on the second combined information for the set of coded bits.

18. The method of claim 13, further comprising:
determining a third puncturing pattern based at least in part on the first puncturing pattern, wherein determining the third puncturing pattern comprises:
additionally flipping, for the each binary representation of the first set of binary representations, binary states for a set of bits of the set of binary bits corresponding to a set of binary bit indices across all of the first set of binary representations, wherein the additional flipping results in a third set of binary representations; and converting the third set of binary representations into the third puncturing pattern.

19. The method of claim 18, further comprising:

receiving, in a third transmission associated with the set of information bits, third information corresponding to a third subset of the set of coded bits, wherein the third subset of the set of coded bits is based at least in part on the set of coded bits and the third puncturing pattern, and wherein the third subset of the set of coded bits has an equivalent decoding performance as the first subset of the set of coded bits and the second subset of the set of coded bits for the polar code;

combining the first information, the second information, and the third information to obtain second combined information for the set of coded bits; and performing a second decoding process according to the polar code on the second combined information for the set of coded bits.

20. The method of claim 13, further comprising:

determining the first puncturing pattern based at least in part on a size of the set of information bits, a size of the set of coded bits, a size of the first subset of the set of coded bits, or a combination thereof.

21. The method of claim 13, wherein combining the first information and the second information to obtain the combined information comprises:

soft-combining a first set of log-likelihood ratios (LLRs) corresponding to the first information with a second set of LLRs corresponding to the second information to obtain a combined set of LLRs corresponding to the combined information.

22. The method of claim 21, wherein soft-combining the first set of LLRs corresponding to the first information with the second set of LLRs corresponding to the second information further comprises:

adding LLRs from the first set of LLRs to LLRs from the second set of LLRs that correspond to same bits of the set of coded bits.

23. The method of claim 13, further comprising:

performing an unsuccessful decoding process according to the polar code on the first information, wherein performing the decoding process according to the polar code on the combined information is based at least in part on the unsuccessful decoding process.

24. The method of claim 23, further comprising:

transmitting a negative acknowledgment (NACK) message in response to the first transmission based at least in part on the unsuccessful decoding process, wherein the second transmission is received based at least in part on the NACK message.

25. A non-transitory computer-readable medium storing code for wireless communications, the code comprising instructions executable by a processor to:

receive, in a first transmission associated with a set of information bits, first information corresponding to a first subset of a set of coded bits, wherein the first subset of the set of coded bits is based at least in part on the set of coded bits and a first puncturing pattern;

receive, in a second transmission associated with the set of information bits, second information corresponding to a second subset of the set of coded bits, wherein the second subset of the set of coded bits is based at least in part on the set of coded bits and a second puncturing pattern, wherein the second puncturing pattern is determined based at least in part on the first puncturing pattern, wherein the non-transitory computer-readable medium further comprises code comprising instructions executable by the processor to:

identify a first set of binary representations for the first puncturing pattern, wherein each binary representation of the first set of binary representations comprises a set of binary bits corresponding to a bit index to puncture according to the first puncturing pattern;

flip, for the each binary representation of the first set of binary representations, a binary state for a bit of the set of binary bits corresponding to a first binary bit index across the first set of binary representations, wherein the flipping results in a second set of binary representations; and convert the second set of binary representations into the second puncturing pattern;

combine the first information and the second information to obtain combined information for the set of coded bits; and perform a decoding process according to a polar code on the combined information for the set of coded bits.

* * * * *